(12) United States Patent
Seok et al.

(10) Patent No.: US 12,154,646 B2
(45) Date of Patent: Nov. 26, 2024

(54) METHOD OF REPROGRAMMING DATA IN NONVOLATILE MEMORY DEVICE, METHOD OF PROGRAMMING DATA IN NONVOLATILE MEMORY DEVICE, NONVOLATILE MEMORY DEVICE PERFORMING THE SAME, AND METHOD OF OPERATING NONVOLATILE MEMORY DEVICE USING THE SAME

(71) Applicant: SAMSUNG ELECTRONICS CO., LTD., Suwon-si (KR)

(72) Inventors: Junyeong Seok, Seoul (KR); Younggul Song, Hwaseong-si (KR); Eunchu Oh, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 117 days.

(21) Appl. No.: 17/816,601

(22) Filed: Aug. 1, 2022

(65) Prior Publication Data
US 2023/0207044 A1 Jun. 29, 2023

(30) Foreign Application Priority Data
Dec. 23, 2021 (KR) .......................... 10-2021-0185668

(51) Int. Cl.
*G11C 29/00* (2006.01)
*G11C 11/56* (2006.01)
(Continued)

(52) U.S. Cl.
CPC .... *G11C 29/50004* (2013.01); *G11C 11/5628* (2013.01); *G11C 11/5642* (2013.01);
(Continued)

(58) Field of Classification Search
CPC . G11C 11/5628; G11C 16/0483; G11C 16/10; G11C 16/26; G11C 11/5642;
(Continued)

(56) References Cited

U.S. PATENT DOCUMENTS 7,542,344 B2 6/2009 Kim
8,060,797 B2 11/2011 Hida et al.
(Continued)

FOREIGN PATENT DOCUMENTS

JP 3636228 1/2005
JP 2011-128751 6/2011
(Continued)

OTHER PUBLICATIONS

EESR Dated May 19, 2023 in Corresponding EP Patent Application No. 22193520.8.

*Primary Examiner* — Thong Q Le
(74) *Attorney, Agent, or Firm* — F. Chau & Associates, LLC

(57) ABSTRACT

In a method of reprogramming data in a nonvolatile memory device including a plurality of pages each of which includes a plurality of memory cells, first page data programmed in a first page is read from among a plurality of page data programmed in the plurality of pages. The plurality of page data have a threshold voltage distribution including a plurality of states. An error correction code (ECC) decoding is performed on the first page data. A reprogram operation is selectively performed on target bits in which an error occurs among a plurality of bits included in the first page data based on a result of performing the ECC decoding on the first page data and a reprogram voltage. The target bits correspond to a first state among the plurality of states. A voltage level of the reprogram voltage is adaptively changed.

19 Claims, 28 Drawing Sheets

(51) Int. Cl.
*G11C 16/10* (2006.01)
*G11C 16/26* (2006.01)
*G11C 29/42* (2006.01)
*G11C 29/50* (2006.01)

(52) U.S. Cl.
CPC .......... *G11C 11/5671* (2013.01); *G11C 16/10* (2013.01); *G11C 16/26* (2013.01); *G11C 29/42* (2013.01); *G11C 2029/5004* (2013.01)

(58) Field of Classification Search
CPC . G11C 16/3459; G11C 16/08; G11C 16/3418; G11C 16/24; G11C 2211/5621; G11C 16/3427; G11C 11/5671; G11C 29/52; G11C 11/5621; G11C 2211/5641; G11C 16/3454; G11C 2211/5642; G11C 16/30; G11C 16/32; G11C 16/34; G11C 29/021; G11C 29/028; G11C 2029/0411; G11C 16/06; G11C 16/04; G11C 2211/5643; G11C 16/3431; G11C 2029/0409; G11C 2216/14; G11C 16/16; G11C 29/42; G11C 16/28; G11C 29/10; G11C 8/08; G11C 11/56; G11C 16/3445; G11C 2207/2245; G11C 7/1039; G11C 7/106; G11C 7/22; G11C 16/102; G11C 16/3404; G11C 29/82; G11C 7/1066; G11C 7/222; G11C 16/14; G11C 2211/5648; G11C 5/143; G11C 7/1087; G11C 16/12; G11C 2029/5004; G11C 2216/20; G11C 29/50004; G11C 5/025; G11C 7/08; G11C 7/1063; G11C 7/109; G11C 8/14; G11C 16/3468; G11C 16/349; G11C 2211/5646; G11C 29/04; G11C 5/06; G11C 7/04; G11C 7/1006; G11C 7/12; G11C 7/225; G11C 11/5635
USPC ............ 365/185.03, 185.12, 185.22, 185.24, 365/185.18, 185.09, 185.11, 185.19, 201, 365/164, 185.17, 185.21, 185.25, 185.29, 365/185.33, 189.05, 230.03
See application file for complete search history.

(56) References Cited

U.S. PATENT DOCUMENTS

| | | | |
|---|---|---|---|
| 9,176,800 | B2 | 11/2015 | Blodgett |
| 9,406,390 | B2 | 8/2016 | Kim et al. |
| 9,965,202 | B2 | 5/2018 | Kogita et al. |
| 10,102,059 | B2 | 10/2018 | Hong |
| 10,109,357 | B2 | 10/2018 | Blodgett |
| 10,290,359 | B2 | 5/2019 | Blodgett |
| 10,796,776 | B2 * | 10/2020 | Suzuki ................. G11C 7/1087 |
| 2013/0031443 | A1 | 1/2013 | Oh et al. |
| 2021/0057033 | A1 | 2/2021 | Lee et al. |

FOREIGN PATENT DOCUMENTS

| | | |
|---|---|---|
| KR | 10-0799018 | 1/2008 |
| KR | 10-2000307 | 7/2019 |

* cited by examiner

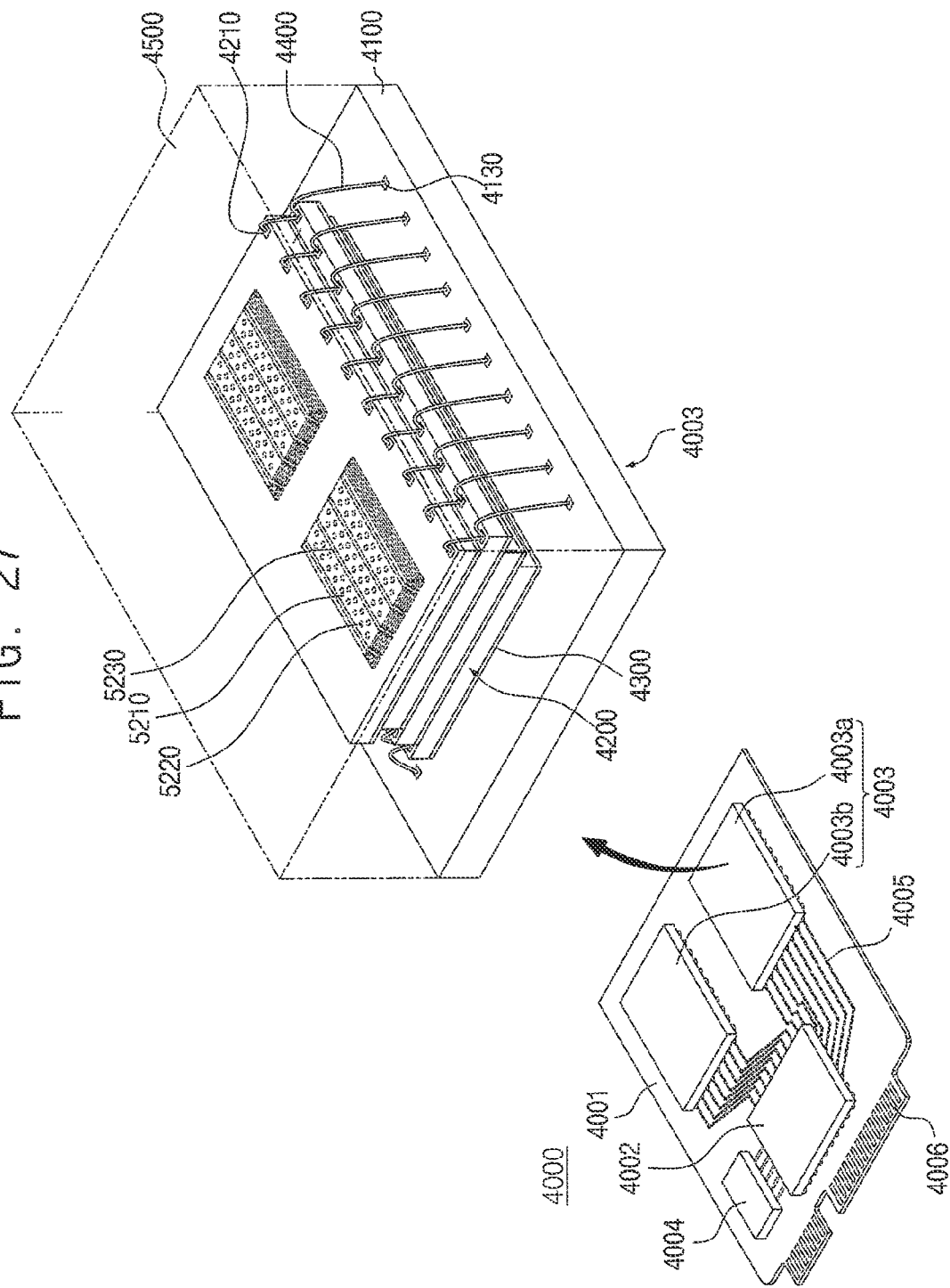

METHOD OF REPROGRAMMING DATA IN NONVOLATILE MEMORY DEVICE, METHOD OF PROGRAMMING DATA IN NONVOLATILE MEMORY DEVICE, NONVOLATILE MEMORY DEVICE PERFORMING THE SAME, AND METHOD OF OPERATING NONVOLATILE MEMORY DEVICE USING THE SAME

CROSS-REFERENCE TO RELATED APPLICATION

This application claims priority under 35 USC § 119 to Korean Patent Application No. 10-2021-0185668 filed on Dec. 23, 2021 in the Korean Intellectual Property Office (KIPO), the contents of which are incorporated by reference in their entirety herein.

1. TECHNICAL FIELD

Example embodiments relate generally to semiconductor integrated circuits, and more particularly to methods of reprogramming data in nonvolatile memory devices, methods of programming data in nonvolatile memory devices, nonvolatile memory devices performing the methods of reprogramming/programming data, and methods of operating nonvolatile memory devices using the methods of reprogramming/programming data.

2. DISCUSSION OF RELATED ART

Semiconductor memory devices include volatile and nonvolatile memory devices. Volatile memory devices lose stored data when disconnected from power, and nonvolatile memory devices retain stored data when disconnected from power. Volatile memory devices may perform read and write operations at a higher speed than nonvolatile memory devices. Nonvolatile memory devices may be used to store data that needs be retained regardless of whether power is provided. Data stored in the nonvolatile memory devices may be degraded due to charge loss over time, and thus errors may occur.

SUMMARY

At least one example embodiment of the present disclosure provides a method of reprogramming data in a nonvolatile memory device capable of efficiently increasing reliability of programmed data.

At least one example embodiment of the present disclosure provides a method of programming data in a nonvolatile memory device that is used to perform the method of reprogramming data.

At least one example embodiment of the present disclosure provides a nonvolatile memory device that performs the method of reprogramming data and/or the method of programming data, and a method of operating a nonvolatile memory device using the method of reprogramming data and/or the method of programming data.

According to an example embodiment, in a method of reprogramming data in a nonvolatile memory device including a plurality of pages each of which includes a plurality of memory cells, first page data programmed in a first page is read from among a plurality of page data programmed in the plurality of pages. The plurality of page data have a threshold voltage distribution including a plurality of states. An error correction code (ECC) decoding is performed on the first page data. A reprogram operation is selectively performed on target bits in which an error occurs among a plurality of bits included in the first page data based on a result of performing the ECC decoding on the first page data and a reprogram voltage. The target bits correspond to a first state among the plurality of states. A voltage level of the reprogram voltage is adaptively changed.

According to an example embodiment, in a method of programming data in a nonvolatile memory device including a plurality of pages each of which includes a plurality of memory cells, first page data is programmed to a first page among the plurality of pages by performing a program loop including a program operation and a program verification operation at least one time. The program operation is performed based on a program voltage. The program verification operation is performed based on a program verification voltage. First program loop completion information representing a number of times program loops are performed while the first page data is programmed is stored in a second page different from the first page.

According to an example embodiment, a nonvolatile memory device includes a memory cell array and a control circuit. The memory cell array includes a plurality of pages each of which includes a plurality of memory cells. The control circuit controls an operation of the memory cell array. The control circuit reads first page data programmed in a first page from among a plurality of page data programmed in the plurality of pages, and selectively performs a reprogram operation on target bits in which an error occurs among a plurality of bits included in the first page data based on a result of performing an error correction code (ECC) decoding on the first page data and a reprogram voltage. The plurality of page data have a threshold voltage distribution including a plurality of states. The target bits correspond to a first state among the plurality of states. A voltage level of the reprogram voltage is adaptively changed.

According to an example embodiment, in a method of operating a nonvolatile memory device including a plurality of pages each of which includes a plurality of memory cells, a plurality of page data are programmed to the plurality of pages. The plurality of page data have a threshold voltage distribution including a plurality of states. The plurality of page data are selectively reprogrammed. When programming the plurality of page data, first page data is programmed to a first page among the plurality of pages by performing a program loop including a program operation and a program verification operation at least one time. The program operation is performed based on a program voltage. The program verification operation is performed based on a program verification voltage. First program loop completion information representing a number of times program loops are performed while the first page data is programmed is stored in a second page different from the first page. When selectively reprogramming the plurality of page data, the first page data programmed in the first page is read. An error correction code (ECC) decoding is performed on the first page data. A reprogram operation is selectively performed on target bits in which an error occurs among a plurality of bits included in the first page data based on a result of performing the ECC decoding on the first page data and a reprogram voltage. The target bits correspond to a first state among the plurality of states. The first page in which the first page data is programmed includes a first data region storing the first page data and a first spare region. A second page in which second page data is programmed after the first page data is programmed includes a second data region in which the second page data is stored and a second spare region in which the first program loop completion information is stored. The voltage level of the reprogram voltage for performing the reprogram operation on the target bits is determined based on the first program loop completion information.

In a method of reprogramming data in the nonvolatile memory device, a method of programming data in the nonvolatile memory device, the nonvolatile memory device and a method of operating the nonvolatile memory device according to example embodiments, when it is determined that the reprogram operation is necessary, the reprogram operation may be performed on a specific state among the plurality of states included in the threshold voltage distribution. For example, the reprogram operation may be performed only on some of the bits having the specific state. In addition, the voltage level of the reprogram voltage used in the reprogram operation may be adaptively changed. For example, the voltage level of the reprogram voltage may be determined based on the program loop completion information. Accordingly, the degradation or deterioration of the reliability of the programmed data may be prevented, and the nonvolatile memory device may have enhanced performance.

BRIEF DESCRIPTION OF THE DRAWINGS

Illustrative, non-limiting example embodiments will be more clearly understood from the following detailed description taken in conjunction with the accompanying drawings.

FIG. 27 is a perspective view of an electronic system including a nonvolatile memory device according to an example embodiment.

DETAILED DESCRIPTION OF THE EMBODIMENTS

Figure 1:
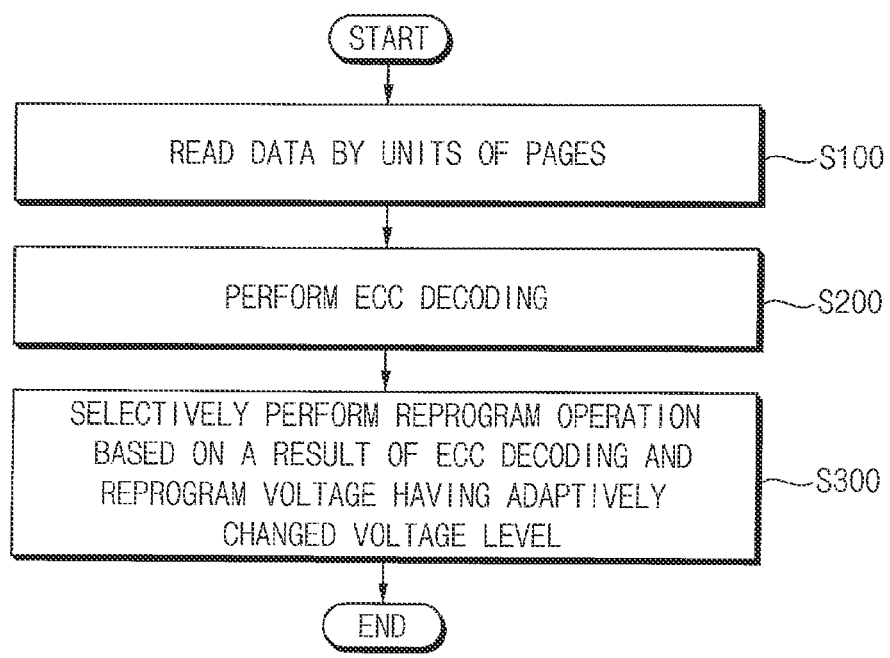
FIG. 1 is a flowchart illustrating a method of reprogramming data in a nonvolatile memory device according to an example embodiment.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a flowchart illustrating a method of reprogramming data in a nonvolatile memory device according to an example embodiment.

Referring to FIG. 1, a method of reprogramming data according to an example embodiment is performed by a nonvolatile memory device that includes a memory cell array and a control circuit. The memory cell array includes a plurality of pages each of which includes a plurality of memory cells, and the control circuit controls an operation of the memory cell array. In addition, the nonvolatile memory device is controlled by a memory controller. Configurations of the nonvolatile memory device and the memory controller will be described in detail with reference to FIGS. 3, 4, 5, 6, 7, 8A and 8B.

In the method of reprogramming data in the nonvolatile memory device according to an example embodiment, data is read or retrieved by units of pages or in a page-by-page basis (step S100). For example, at least one of a plurality of page data programmed in the plurality of pages may be read. The plurality of page data may have a threshold voltage distribution (or a distribution of threshold voltages) including a plurality of states. Examples of the threshold voltage distribution will be described with reference to FIGS. 9, 10A, 10B and 10C.

A data read operation performed in step S100 may be a data recovery read operation for increasing reliability of programmed data. For example, to prevent failure in error correction for the programmed data, when a predetermined number or more of errors occur in the programmed data, the errors may be reduced by rewriting the programmed data. For example, to reduce the errors in the programmed data, the data recovery read operation may be performed. For example, step S100 may be performed by the nonvolatile memory device based on a read command (e.g., a data recovery read command) received from the memory controller.

An error correction code (ECC) decoding is performed on the data read in step S100 (step S200). For example, the ECC decoding may be performed on at least one of the plurality of read page data.

In an example embodiment, the ECC decoding in step S200 is performed by the memory controller. For example, the nonvolatile memory device may transmit the read data to the memory controller, the memory controller may perform the ECC decoding on the read data, and the memory controller may transmit a result of the ECC decoding and/or a command/control signal generated based on the result of the ECC decoding to the nonvolatile memory device.

Based on the result of the ECC decoding performed in step S200 and a reprogram voltage having a voltage level that is adaptively changed or determined, a reprogram operation is selectively performed on some bits included in the data read in step S100 (step S300). For example, when it is determined that the reprogram operation is necessary or required, the some bits may be selected, and the reprogram voltage may be applied only to memory cells in which the some bits are stored. For example, step S300 may be performed by the nonvolatile memory device based on a reprogram command and/or a reprogram control signal received from the memory controller. For example, once the memory controller determines the reprogram operation is to be performed from the ECC decoding, the memory controller may output the reprogram command and/or the reprogram control signal to the nonvolatile memory device to inform the nonvolatile memory device which memory cells and which bit of the memory cells to reprogram.

In an example embodiment, the voltage level of the reprogram voltage is determined based on program loop completion information that represents the number of times program loops are performed while data is programmed. The program loop and the program loop completion information will be described in detail with reference to FIGS. 11A, 11B, 11C and 11D.

In an example embodiment, the voltage level of the reprogram voltage is determined based on a shifted amount of threshold voltages due to or caused by a change in the threshold voltage distribution including the plurality of states. The change in the threshold voltage distribution will be described with reference to FIGS. 10A, 10B and 10C.

In the method of reprogramming data in the nonvolatile memory device according to an example embodiment, when it is determined that the reprogram operation is necessary, the reprogram operation may be performed on a specific state among the plurality of states included in the threshold voltage distribution. For example, the reprogram operation may be performed only on some of bits corresponding to the specific state. In addition, the voltage level of the reprogram voltage used in the reprogram operation may be adaptively changed. For example, the voltage level of the reprogram voltage may be determined based on the program loop completion information. Accordingly, the degradation or deterioration of the reliability of the programmed data may be prevented, and the nonvolatile memory device may have enhanced performance.

Figure 2:
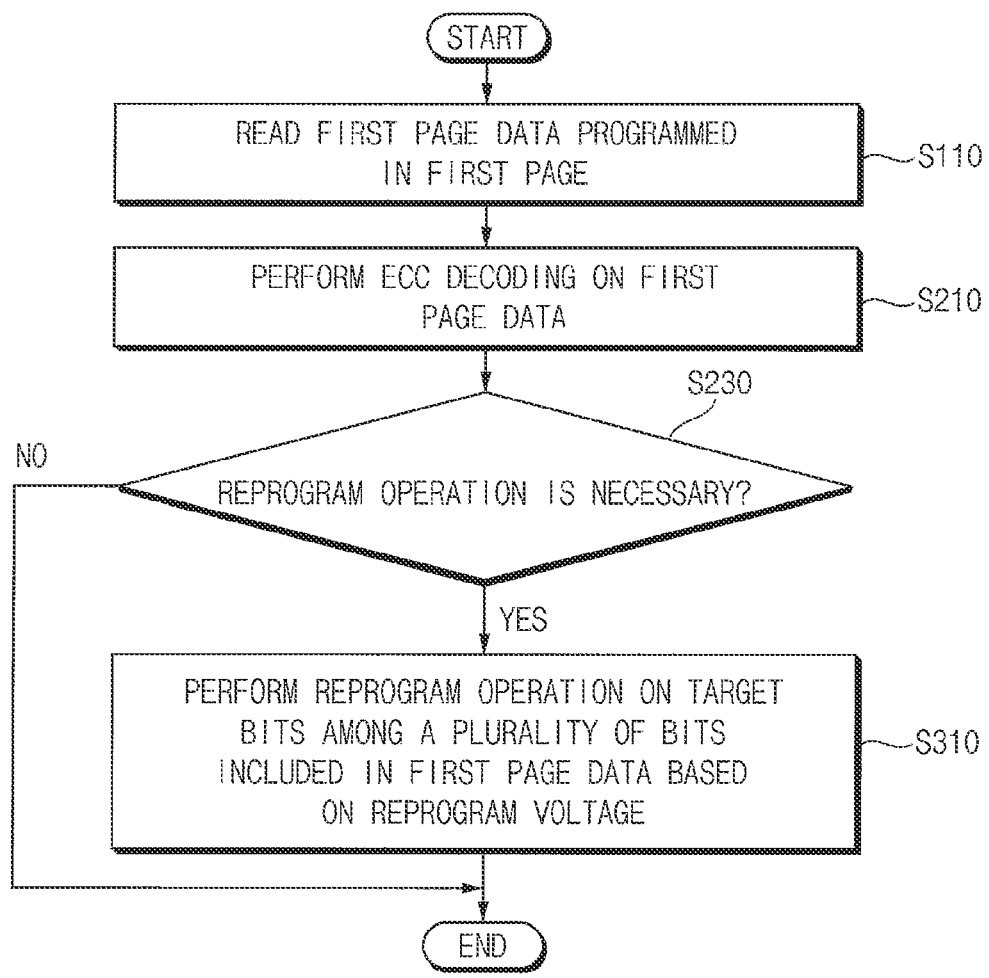
FIG. 2 is a flowchart illustrating an example of a method of reprogramming data in a nonvolatile memory device of FIG. 1.

FIG. 2 is a flowchart illustrating an example of a method of reprogramming data in a nonvolatile memory device of FIG. 1. The descriptions repeated with FIG. 1 will be omitted.

FIG. 2 illustrates detailed operations associated with or related to one page in the method of reprogramming data in the nonvolatile memory device of FIG. 1.

Referring to FIGS. 1 and 2, in step S100, first page data is read from among the plurality of page data (step S110). The first page data is programmed in a first page, and the plurality of page data are programmed in the plurality of pages. For example, the read of the first page data may including reading data from a single page.

In step S200, the ECC decoding is performed on the first page data (step S210). Based on a result of the ECC decoding on the first page data, it is determined whether the reprogram operation is necessary for the first page data (step S230). Step S210 will be described with reference to FIGS. 15 and 16.

When it is determined that the reprogram operation is necessary for the first page data (step S230: YES), in step S300, the reprogram operation is performed on target bits among a plurality of bits included in the first page data based on the reprogram voltage (step S310). The target bits are bits in which an error occurs and corresponds to a first state among the plurality of states. The target bits may be referred to as error bits. Step S310 will be described with reference to FIG. 17. The target bits may be bits in which an error is predicted to occur. The target bits may correspond to a single one of the states or two or more of the states, but less than all the states.

When it is determined that the reprogram operation is unnecessary for the first page data (step S230: NO), step S310 is not performed (e.g., the reprogram operation is not performed), and the process may be terminated.

Although FIG. 2 illustrates only the operations associated with one page, example embodiments are not limited thereto, and the above-described operations may be performed on all or some of the plurality of pages. For example, steps S110, S210, S230 and S310 in FIG. 2 may be sequentially performed on two or more pages.

Figure 3:
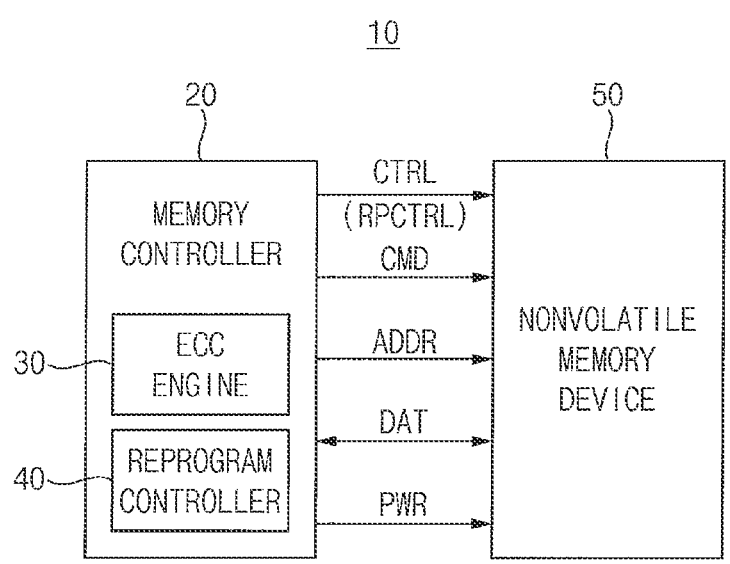
FIG. 3 is a block diagram illustrating a memory system including a nonvolatile memory device according to an example embodiment.

FIG. 3 is a block diagram illustrating a memory system including a nonvolatile memory device according to an example embodiment.

Referring to FIG. 3, a memory system 10 includes a memory controller 20 (e.g., a control circuit) and a nonvolatile memory device 50.

The nonvolatile memory device 50 may perform data erase, write (or program) and/or read operations under control of the memory controller 20. The nonvolatile memory device 50 may receive a command CMD and an address ADDR through input/output (I/O) lines from the memory controller 20 for performing such data erase, write and/or read operations, and may exchange data DAT with the memory controller 20 for performing such a data write and/or read operation. In addition, the nonvolatile memory device 50 may receive a control signal CTRL through a control line from the memory controller 20. Further, the nonvolatile memory device 50 may receive power PWR through a power line from the memory controller 20.

The memory controller 20 may include an ECC engine 30 (e.g., a logic circuit) and a reprogram controller 40 (e.g., a control circuit).

The ECC engine 30 may perform an ECC encoding and an ECC decoding. In the data write operation, the ECC engine 30 may generate parity data by performing the ECC encoding on the data DAT to be stored, and may provide the data DAT and the parity data to the nonvolatile memory device 50. The data DAT and the parity data may be stored in at least one page included in the nonvolatile memory device 50. In the data read operation, the ECC engine 30 may receive the data DAT read from the nonvolatile memory device 50 and parity data corresponding to the data DAT from the nonvolatile memory device 50, and may correct or compensate an error in the data DAT by performing the ECC decoding based on the data DAT and the parity data. For example, the ECC engine 30 may perform step S200 in FIG. 1.

The reprogram controller 40 may control a reprogram operation of the nonvolatile memory device 50. In the data write operation, the reprogram controller 40 may control the nonvolatile memory device 50 such that a parameter (e.g., program loop completion information, an initial level of a threshold voltage, etc.) used to determine the voltage level of the reprogram voltage is recorded. In the data read operation (e.g., data recovery read operation), the reprogram controller 40 may determine whether the reprogram operation is necessary. When it is determined that the reprogram operation is necessary, the reprogram controller 40 may select target bits corresponding to a part of a specific state, may determine the voltage level of the reprogram voltage based on the recorded parameter, and may control the nonvolatile memory device 50 such that the reprogram operation is performed. For example, the target bits may be bits corresponding to a certain threshold voltage distribution that have an error. For example, the reprogram controller 40 may control the nonvolatile memory device 50 to perform step S300 in FIG. 1 and may provide a reprogram control signal RPCTRL to the nonvolatile memory device 50.

The nonvolatile memory device 50 may be a nonvolatile memory device according to an example embodiment, and may perform steps S100 and S300 in FIG. 1.

Figure 4:
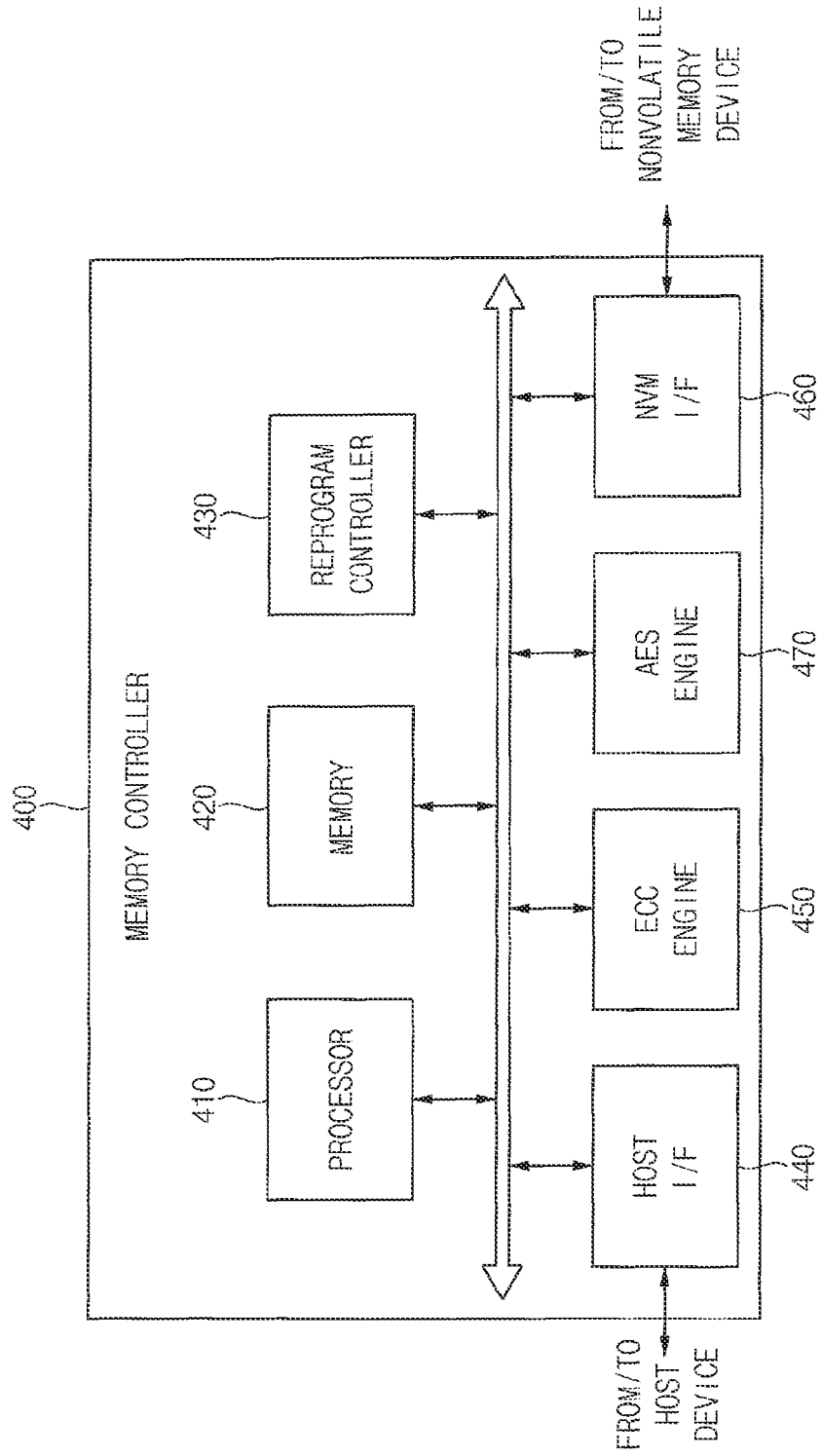
FIG. 4 is a block diagram illustrating an example of a memory controller included in a memory system according to an example embodiment.

FIG. 4 is a block diagram illustrating an example of a memory controller included in a memory system according to an example embodiment.

Referring to FIG. 4, a memory controller 400 may include a processor 410, a memory 420, a reprogram controller 430 (e.g., a control circuit), a host interface (I/F) 440 (e.g., an interface circuit), an ECC engine 450 (e.g., a logic circuit), a nonvolatile memory (NVM) interface 460 (e.g., an interface circuit) and an advanced encryption standard (AES) engine 470 (e.g., a logic circuit). The memory controller 400 may be used to implement the memory controller 20 of FIG. 3.

The processor 410 may control an operation of the memory controller 400 in response to a command received via the host interface 440 from a host device (not illustrated). For example, the processor 410 may control an operation of a memory system (e.g., the memory system 10 in FIG. 3), and may control respective components by employing firmware for operating the memory system.

The memory 420 may store instructions and data executed and processed by the processor 410. For example, the memory 420 may be implemented with a volatile memory, such as a dynamic random access memory (DRAM), a static random access memory (SRAM), a cache memory, or the like.

The reprogram controller 430 may be substantially the same as the reprogram controller 40 in FIG. 3, and may be used to implement the method of reprogramming data in the nonvolatile memory device according to an example embodiment. In an example embodiment, at least a part of the reprogram controller 430 may be implemented as hardware. For example, at least a part of the reprogram controller 430 may be included in a computer-based electronic system. In an example embodiment, at least a part of the reprogram controller 430 is implemented as instruction codes or program routines (e.g., a software program). For example, the instruction codes or the program routines may be executed by a computer-based electronic system, and may be stored in any storage device located inside or outside the computer-based electronic system.

The ECC engine 450 for error correction may be substantially the same as the ECC engine 30 in FIG. 3. The ECC engine 450 may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using the above-described codes or other error correction codes.

The host interface 440 may provide physical connections between the host device and the memory system. The host interface 440 may provide an interface corresponding to a bus format of the host device for communication between the host device and the memory system.

The nonvolatile memory interface 460 may exchange data with a nonvolatile memory device (e.g., the nonvolatile memory device 50 in FIG. 3). The nonvolatile memory interface 460 may transfer data to the nonvolatile memory device (e.g., memory device 50), or may receive data read from the nonvolatile memory device (e.g., memory device 50). For example, the nonvolatile memory interface 460 may be configured to comply with a standard protocol, such as Toggle or open NAND flash interface (ONFI).

The AES engine 470 may perform at least one of an encryption operation and a decryption operation on data input to the storage controller 400 by using a symmetric-key algorithm. Although not illustrated in detail, the AES engine 470 may include an encryption module and a decryption module. For example, the encryption module and the decryption module may be implemented as separate modules. In another example, one module capable of performing both encryption and decryption operations may be implemented in the AES engine 470.

Figure 5:
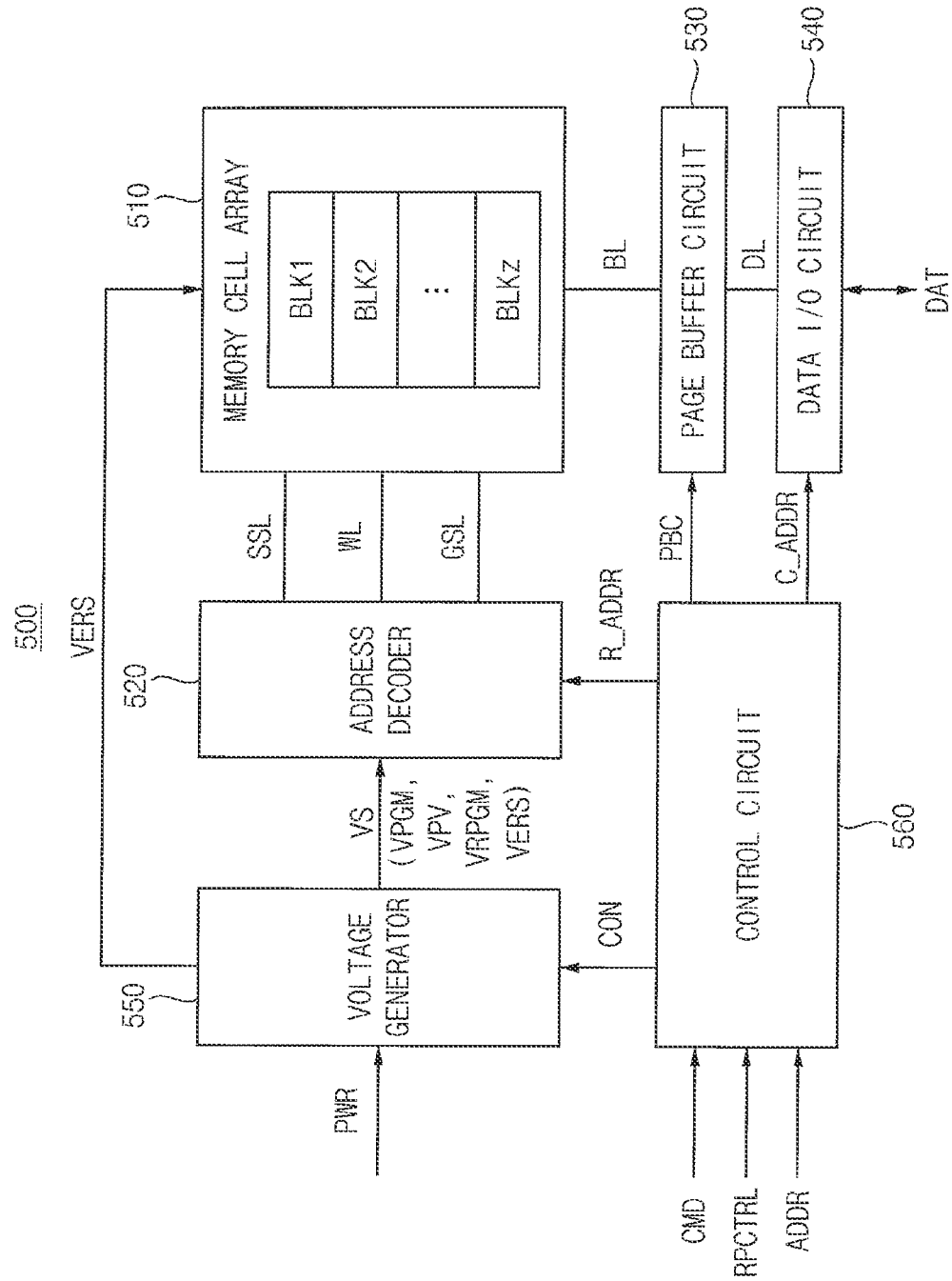
FIG. 5 is a block diagram illustrating a nonvolatile memory device according to an example embodiment.

FIG. 5 is a block diagram illustrating a nonvolatile memory device according to an example embodiment.

Referring to FIG. 5, a nonvolatile memory device 500 includes a memory cell array 510, an address decoder 520, a page buffer circuit 530, a data I/O circuit 540, a voltage generator 550 and a control circuit 560. The nonvolatile memory device 500 may be used to implement the nonvolatile memory device 50 of FIG. 3.

The memory cell array 510 is connected to the address decoder 520 via a plurality of string selection lines SSL, a plurality of wordlines WL and a plurality of ground selection lines GSL. The memory cell array 510 is further connected to the page buffer circuit 530 via a plurality of bitlines BL. The memory cell array 510 may include a plurality of memory cells (e.g., a plurality of nonvolatile memory cells) that are connected to the plurality of wordlines WL and the plurality of bitlines BL. The memory cell array 510 may be divided into a plurality of memory blocks BLK1, BLK2, . . . , BLKz each of which includes memory cells. In addition, each of the plurality of memory blocks BLK1 to BLKz may be divided into a plurality of pages.

In an example embodiment, as will be described with reference to FIGS. 6 and 7, the memory cell array 510 may be a three-dimensional (3D) memory cell array, which is formed on a substrate in a three-dimensional structure (or a vertical structure). In this example, the memory cell array 510 may include a plurality of cell strings (e.g., a plurality of vertical NAND strings) that are vertically oriented such that at least one memory cell is located over another memory cell.

The control circuit 560 receives a command CMD and an address ADDR from outside (e.g., from the memory controller 20 in FIG. 3), and controls erasure, programming and read operations of the nonvolatile memory device 500 based on the command CMD and the address ADDR. An erasure operation may include performing a sequence of erase loops, and a programming operation may include performing a sequence of program loops. Each program loop may include a program operation and a program verification operation. Each erase loop may include an erase operation and an erase verification operation. The read operation may include a normal read operation and a data recovery read operation.

For example, the control circuit 560 may generate control signals CON, which are used for controlling the voltage generator 550, and may generate a control signal PBC for controlling the page buffer circuit 530, based on the command CMD, and may generate a row address R_ADDR and a column address C_ADDR based on the address ADDR. The control circuit 560 may provide the row address R_ADDR to the address decoder 520 and may provide the column address C_ADDR to the data I/O circuit 540.

In addition, the control circuit 560 may control the address decoder 520, the page buffer circuit 530, the data I/O circuit 540 and the voltage generator 550 such that the nonvolatile memory device 500 performs the method of reprogramming data in the nonvolatile memory device according to example embodiments described with reference to FIG. 1. For example, when it is determined based on as a result of the data recovery read operation that the reprogram operation is necessary, the control circuit 560 may perform the reprogram operation only on the target bits corresponding to a part of the specific state, using a reprogram voltage VRPGM having a voltage level determined by the program loop completion information, the shifted amount of threshold voltages, etc. based on the reprogram control signal RPCTRL.

The address decoder 520 may be connected to the memory cell array 510 via the plurality of string selection lines SSL, the plurality of wordlines WL and the plurality of ground selection lines GSL.

For example, in the data erase/write/read operations, the address decoder 520 may determine at least one of the plurality of wordlines WL as a selected wordline, and may determine the rest or remainder of the plurality of wordlines WL other than the selected wordline as unselected wordlines, based on the row address R_ADDR.

In addition, in the data erase/write/read operations, the address decoder 520 may determine at least one of the plurality of string selection lines SSL as a selected string selection line, and may determine the rest or remainder of the plurality of string selection lines SSL other than the selected string selection line as unselected string selection lines, based on the row address R_ADDR.

Further, in the data erase/write/read operations, the address decoder 520 may determine at least one of the plurality of ground selection lines GSL as a selected ground selection line, and may determine the rest or remainder of the plurality of ground selection lines GSL other than the selected ground selection line as unselected ground selection lines, based on the row address R_ADDR.

The voltage generator 550 may generate voltages VS that are required for an operation of the nonvolatile memory device 500 based on a power PWR and the control signals CON. The voltages VS may be applied to the plurality of string selection lines SSL, the plurality of wordlines WL and the plurality of ground selection lines GSL via the address decoder 520. For example, the voltages VS may include a program voltage VPGM and a program verification voltage VPV required for the program loops, the reprogram voltage VRPGM required for the reprogram operation, or the like. In addition, the voltage generator 550 may generate an erase voltage VERS that is required for the data erase operation based on the power PWR and the control signals CON. The erase voltage VERS may be applied to the memory cell array 510 directly or via the bitline BL.

For example, during the erase operation, the voltage generator 550 may apply the erase voltage VERS to a common source line and/or the bitline BL of a memory block (e.g., a selected memory block) and may apply an erase permission voltage (e.g., a ground voltage) to all wordlines of the memory block or a portion of the wordlines via the address decoder 520. In addition, during the erase verification operation, the voltage generator 550 may apply an erase verification voltage simultaneously to all wordlines of the memory block or sequentially to the wordlines one by one.

For example, during the program operation, the voltage generator 550 may apply the program voltage VPGM to the selected wordline and may apply a program pass voltage to the unselected wordlines via the address decoder 520. In addition, during the program verification operation, the voltage generator 550 may apply the program verification voltage VPV to the selected wordline and may apply a verification pass voltage to the unselected wordlines via the address decoder 520. For example, during the reprogram operation, the voltage generator 550 may apply the reprogram voltage VRPGM to the selected wordline via the address decoder 520.

In addition, during the normal read operation, the voltage generator 550 may apply a read voltage to the selected wordline and may apply a read pass voltage to the unselected wordlines via the address decoder 520. During the data recovery read operation, the voltage generator 550 may apply the read voltage to a wordline adjacent to the selected wordline and may apply a recovery read voltage to the selected wordline via the address decoder 520.

The page buffer circuit 530 may be connected to the memory cell array 510 via the plurality of bitlines BL. The page buffer circuit 530 may include a plurality of page buffers. In some example embodiments, each page buffer may be connected to one bitline. In other example embodiments, each page buffer may be connected to two or more bitlines.

The page buffer circuit 530 may store data DAT to be programmed into the memory cell array 510 or may read data DAT sensed from the memory cell array 510. In other words, the page buffer circuit 530 may operate as a write driver or a sensing amplifier according to an operation mode of the nonvolatile memory device 500.

The data I/O circuit 540 may be connected to the page buffer circuit 530 via data lines DL. The data I/O circuit 540 may provide the data DAT from outside of the nonvolatile memory device 500 (e.g., from the memory controller 20 in FIG. 3) to the memory cell array 510 via the page buffer circuit 530 or may provide the data DAT from the memory cell array 510 to the outside of the nonvolatile memory device 500 (e.g., to the memory controller 20 in FIG. 3), based on the column address C_ADDR.

Figure 6:
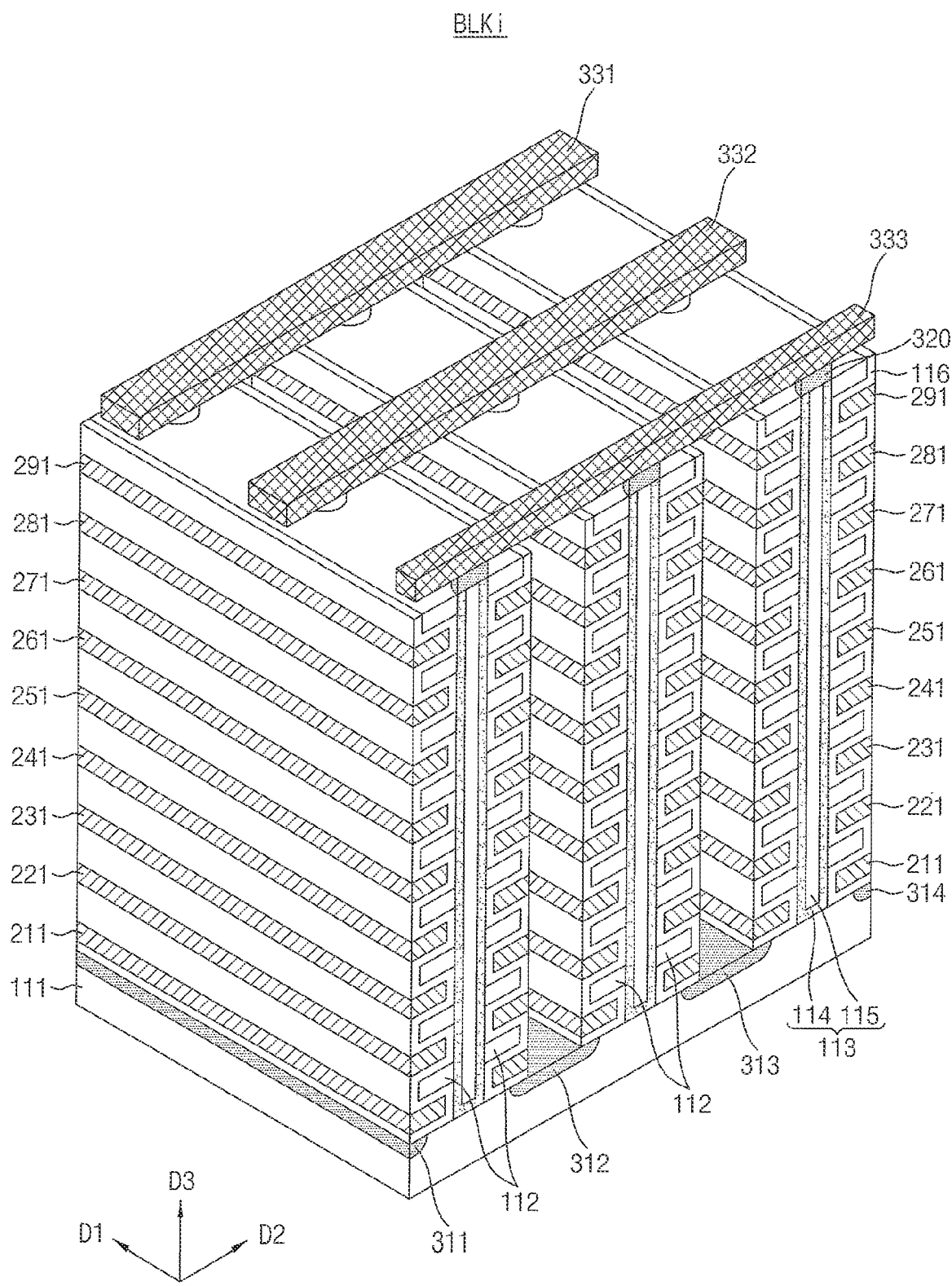
FIG. 6 is a perspective view illustrating an example of a memory block included in a memory cell array in a nonvolatile memory device of FIG. 5.

FIG. 6 is a perspective view illustrating an example of a memory block included in a memory cell array in a nonvolatile memory device of FIG. 5.

Referring to FIG. 6, a memory block BLKi includes a plurality of cell strings (e.g., a plurality of vertical NAND strings) which are formed on a substrate in a three-dimensional structure (or a vertical structure). The memory block BLKi includes structures extending along first, second and third directions D1, D2 and D3.

A substrate 111 is provided. For example, the substrate 111 may have a well of a first type of charge carrier impurity (e.g., a first conductivity type) therein. For example, the substrate 111 may have a p-well formed by implanting a group 3 element such as boron (B). In particular, the substrate 111 may have a pocket p-well provided within an n-well. In an embodiment, the substrate 111 has a p-type well (or a p-type pocket well). However, the conductive type of the substrate 111 is not limited to p-type.

A plurality of doping regions 311, 312, 313 and 314 arranged along the second direction D2 are provided in/on the substrate 111. These plurality of doping regions 311 to 314 may have a second type of charge carrier impurity (e.g., a second conductivity type) different from the first type of the substrate 111. In an embodiment, the first to fourth doping regions 311 to 314 may be an n-type. However, the conductive type of the first to fourth doping regions 311 to 314 is not limited to n-type.

A plurality of insulation materials 112 extending along the first direction D1 are sequentially provided along the third direction D3 on a region of the substrate 111 between the first and second doping regions 311 and 312. For example, the plurality of insulation materials 112 are provided along the third direction D3, being spaced by a specific distance. For example, the insulation materials 112 may include an insulation material such as an oxide layer.

A plurality of pillars 113 penetrating the insulation materials along the third direction D3 are sequentially disposed along the first direction D1 on a region of the substrate 111 between the first and second doping regions 311 and 312. For example, the plurality of pillars 113 penetrate the insulation materials 112 to contact the substrate 111.

In an example embodiment, each pillar 113 includes a plurality of materials. For example, a channel layer 114 of each pillar 113 may include a silicon material having a first conductivity type. For example, the channel layer 114 of each pillar 113 may include a silicon material having the same conductivity type as the substrate 111. In an embodiment, the channel layer 114 of each pillar 113 includes p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. In an example, the internal material 115 of each pillar 113 includes an air gap. The term "air" as discussed herein, may refer to atmospheric air, or other gases that may be present during the manufacturing process.

An insulation layer 116 is provided along the exposed surfaces of the insulation materials 112, the pillars 113, and the substrate 111, on a region between the first and second doping regions 311 and 312. For example, the insulation layer 116 provided on surfaces of the insulation material 112 may be interposed between pillars 113 and a plurality of stacked first conductive materials 211, 221, 231, 241, 251, 261, 271, 281 and 291, as illustrated. In some examples, the insulation layer 116 need not be provided between the first conductive materials 211 to 291 corresponding to ground selection lines GSL (e.g., 211) and string selection lines SSL (e.g., 291). In this example, the ground selection lines GSL are the lowermost ones of the stack of first conductive materials 211 to 291 and the string selection lines SSL are the uppermost ones of the stack of first conductive materials 211 to 291.

The plurality of first conductive materials 211 to 291 are provided on surfaces of the insulation layer 116, in a region between the first and second doping regions 311 and 312. For example, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111.

A first conductive material extending along the first direction D1 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may be formed of a conductive metal, but the first conductive materials 211 to 291 may include a conductive material such as a polysilicon in other embodiments.

The same structures as those on the first and second doping regions 311 and 312 may be provided in a region between the second and third doping regions 312 and 313. In the region between the second and third doping regions 312 and 313, a plurality of insulation materials 112 are provided, which extend along the first direction D1. A plurality of pillars 113 are provided that are disposed sequentially along the first direction D1 and penetrate the plurality of insulation materials 112 along the third direction D3. An insulation layer 116 is provided on the exposed surfaces of the plurality of insulation materials 112 and the plurality of pillars 113, and a plurality of first conductive materials 211 to 291 extend along the first direction D1. Similarly, the same structures as those on the first and second doping regions 311 and 312 may be provided in a region between the third and fourth doping regions 313 and 314.

A plurality of drain regions 320 are provided on the plurality of pillars 113, respectively. The drain regions 320 may include silicon materials doped with a second type of charge carrier impurity. For example, the drain regions 320 may include silicon materials doped with an n-type dopant. In an embodiment, the drain regions 320 include n-type silicon materials. However, the drain regions 320 are not limited to n-type silicon materials.

On the drain regions, a plurality of second conductive materials 331, 332 and 333 are provided, which extend along the second direction D2. The second conductive materials 331 to 333 are disposed along the first direction D1, being spaced apart from each other by a specific distance. The second conductive materials 331 to 333 are respectively connected to the drain regions 320 in a corresponding region. The drain regions 320 and the second conductive material 333 extending along the second direction D2 may be connected through each contact plug. Each contact plug may be, for example, a conductive plug formed of a conductive material such as a metal. The second conductive materials 331 to 333 may include metal materials. The second conductive materials 331 to 333 may include conductive materials such as a polysilicon.

In the example of FIG. 6, the first conductive materials 211 to 291 may be used to form the wordlines WL, the string selection lines SSL and the ground selection lines GSL. For example, the first conductive materials 221 to 281 may be used to form the wordlines WL, where conductive materials belonging to the same layer may be interconnected. The second conductive materials 331 to 333 may be used to form the bitlines BL. The number of layers of the first conductive materials 211 to 291 may be variously determined according to process and control techniques.

Figure 7:
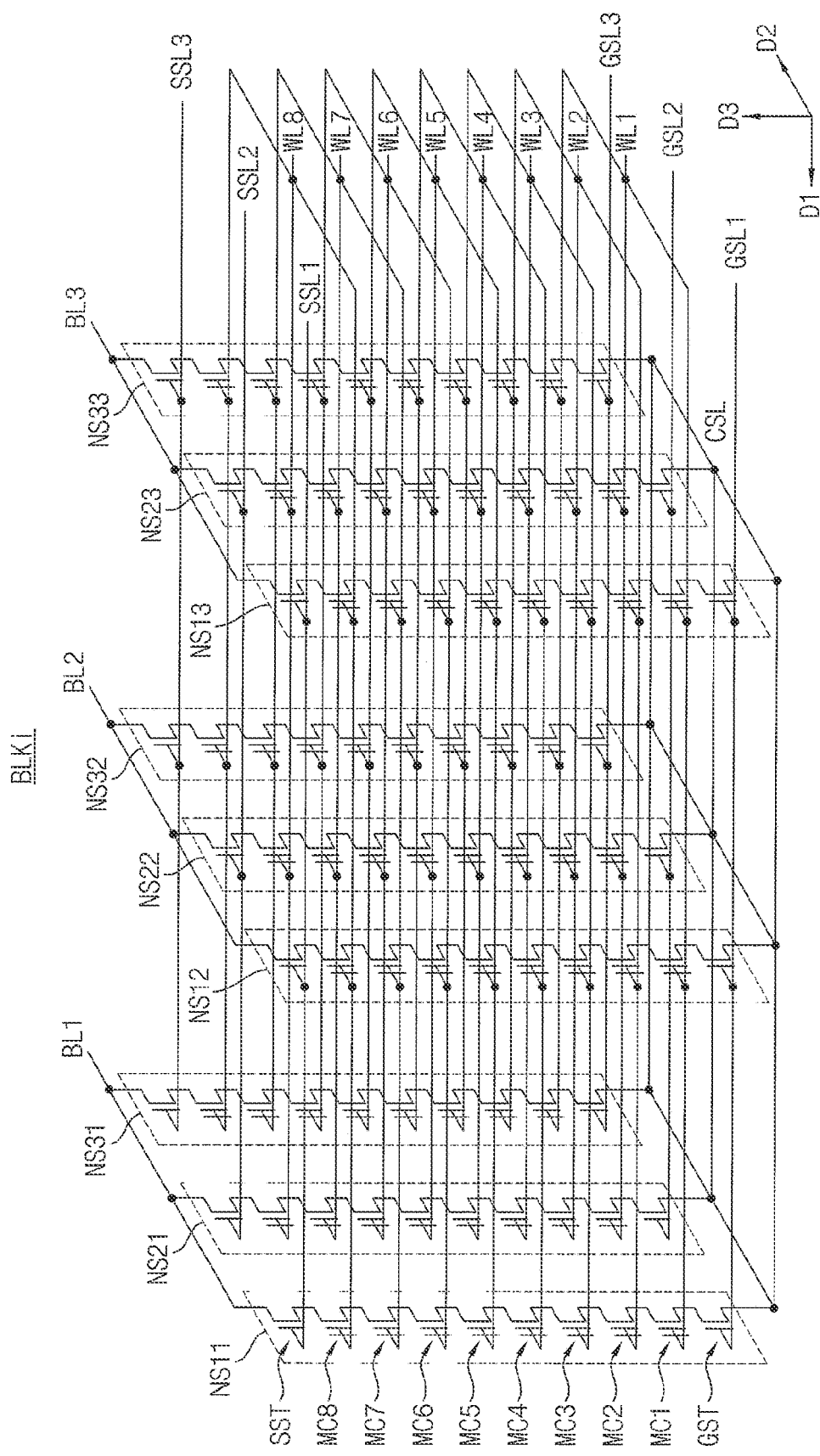
FIG. 7 is a circuit diagram illustrating an equivalent circuit of a memory block described with reference to FIG. 6.

FIG. 7 is a circuit diagram illustrating an equivalent circuit of a memory block described with reference to FIG. 6.

A memory block BLKi of FIG. 7 may be formed on a substrate in a three-dimensional structure (or a vertical structure). For example, a plurality of NAND strings included in the memory block BLKi may be formed in a direction perpendicular to the substrate.

Referring to FIG. 7, the memory block BLKi may include a plurality of NAND strings NS11, NS12, NS13, NS21, NS22, NS23, NS31, NS32 and NS33 connected between bitlines BL1, BL2 and BL3 and a common source line CSL. Each of the NAND strings NS11 to NS33 may include a string selection transistor SST, a plurality of memory cells MC1, MC2, MC3, MC4, MC5, MC6, MC7 and MC8, and a ground selection transistor GST. For example, the bitlines BL1 to BL3 may correspond to the second conductive materials 331 to 333 in FIG. 6, and the common source line CSL may be formed by interconnecting the first to fourth doping regions 311 to 314 in FIG. 6.

Each string selection transistor SST may be connected to a corresponding string selection line (one of SSL1, SSL2 and SSL3). The plurality of memory cells MC1 to MC8 may be connected to corresponding wordlines WL1, WL2, WL3, WL4, WL5, WL6, WL7 and WL8, respectively. Each ground selection transistor GST may be connected to a corresponding ground selection line (one of GSL1, GSL2 and GSL3). Each string selection transistor SST may be connected to a corresponding bitline (e.g., one of BL1 to BL3), and each ground selection transistor GST may be connected to the common source line CSL. In the example of FIG. 7, some of the string selection transistors SST are connected to the same bitline (e.g., one of BL1 to BL3) to connect corresponding NAND strings to the same bitline via appropriate selection via selection voltages applied to the appropriate sting selection lines SSL1 to SSL3 and ground selection lines GSL1 to GSL3.

The cell strings connected in common to one bitline may form one column, and the cell strings connected to one string selection line may form one row. For example, the cell strings NS11, NS21 and NS31 connected to the first bitline BL1 may correspond to a first column, and the cell strings NS11, NS12 and NS13 connected to the first string selection line SSL1 may form a first row.

Wordlines (e.g., WL1) having the same height may be commonly connected, and the ground selection lines GSL1 to GSL3 and the string selection lines SSL1 to SSL3 may be separated. Memory cells located at the same semiconductor layer share a wordline. Cell strings in the same row share a string selection line. The common source line CSL is connected in common to all of the cell strings.

In FIG. 7, the memory block BLKi is illustrated to be connected to eight wordlines WL1 to WL8 and three bitlines BL1 to BL3, and each of the NAND strings NS11 to NS33 is illustrated to include eight memory cells MC1 to MC8. However, example embodiments are not limited thereto. In some example embodiments, each memory block may be connected to any number of wordlines and bitlines, and each NAND string may include any number of memory cells.

A three-dimensional vertical array structure may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

Although the memory cell array included in the nonvolatile memory device according to example embodiments is described based on a NAND flash memory device, the nonvolatile memory device according to example embodiments may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 8A:
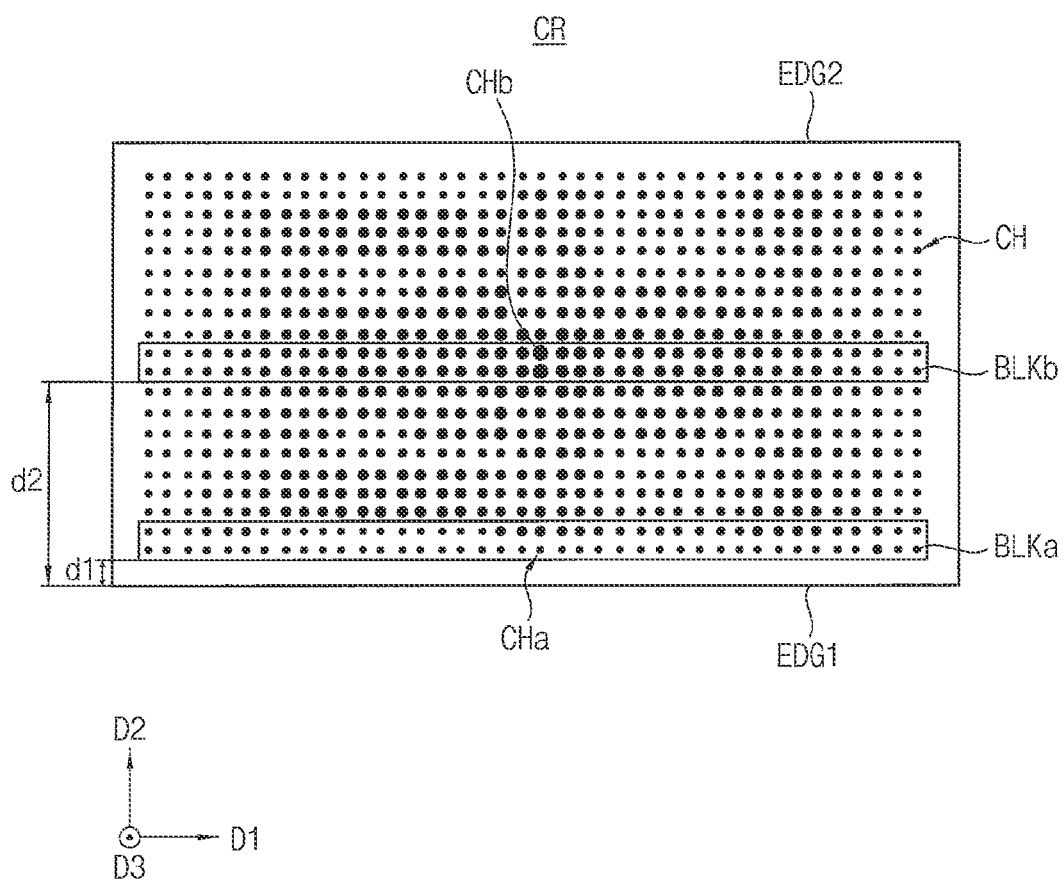
FIG. 8A is a plan view of an example of a cell region included in a memory cell array of FIGS. 6 and 7.

FIG. 8A is a plan view of an example of a cell region included in a memory cell array of FIGS. 6 and 7.

Referring to FIG. 8A, a cell region CR may include a plurality of channel holes CH.

A channel hole size, for example, a channel hole diameter, may vary according to positions within the cell region CR. For example, portions adjacent to first and second edges EDG1 and EDG2 may have a relatively low peripheral density, and thus channel holes CHa adjacent to the first and second edges EDG1 and EDG2 may have different diameters from those of the other channel holes CH. In an embodiment, channel holes CHb located in a center of the cell region CR have diameters larger than those of the channel holes CHa adjacent to the first and second edges EDG1 and EDG2. A memory block BLKa may be adjacent to the second edge EDG2, and may be spaced apart from the second edge EDG2 by a first distance d1. A memory block BLKb not adjacent to the first and second edges EDG1 and EDG2 may be in the center of the cell region CR, and may be spaced apart from the second edge EDG2 by a second distance d2. In an embodiment, the second distance d2 is greater than the first distance d1. In an embodiment, a first diameter of the channel hole CHa included in the memory block BLKa is smaller than a second diameter of the channel hole CHb included in the memory block BLKb.

Figure 8B:
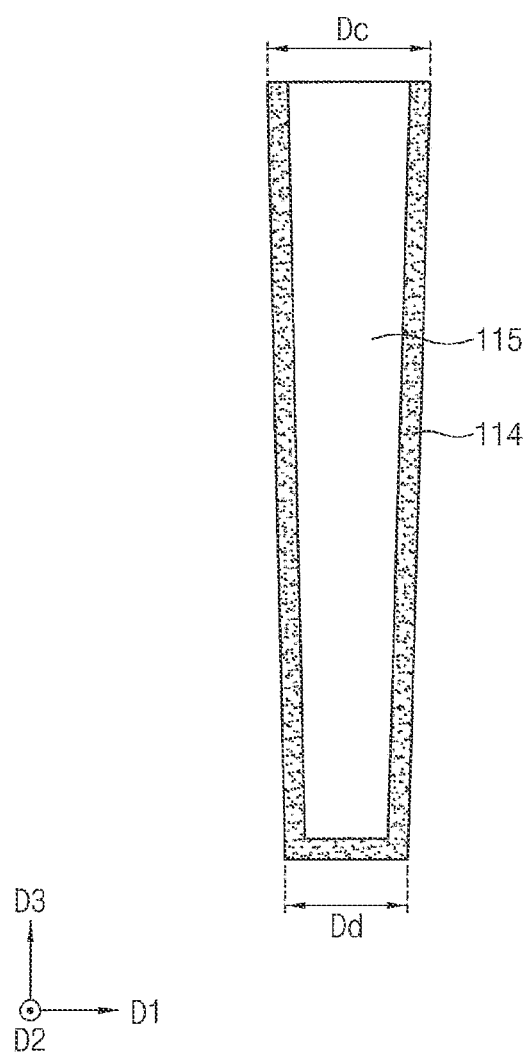
FIG. 8B is a cross-sectional view of an example of a channel hole formed in a cell region of FIG. 8A.

FIG. 8B is a cross-sectional view of an example of a channel hole formed in a cell region of FIG. 8A.

Referring to FIG. 8B, a pillar including a channel layer 114 and an internal layer 115 may be formed in a channel hole CHc. For example, the channel hole CHc may be drilled from the top to the bottom, and a diameter Dc on a position where the formation of the channel hole CHc starts (e.g., on the top) may be larger than a diameter Dd on a position where the formation of the channel hole CHc ends (e.g., on the bottom). For example, the channel hole CHc may be included in one memory block. For example, one of the channel holes CH, CHa, or CHb of FIG. 8A may be implemented by the channel hole CHc.

As described above, the diameter of the channel hole may vary depending on the position in the cell region CR, and the diameter of the channel hole may also vary depending on the third direction D3 even within one channel hole. Due to the difference in the channel hole diameter (e.g., size), a difference in characteristic or reliability (e.g., data retention characteristic) of the memory cells and pages may occur. For example, as the diameter of the channel hole increases, the amount of reliability degradation may decrease or it may be robust against reliability degradation (e.g., the larger the diameter of the channel hole, the less the amount of reliability degradation or the more robust or resistant against reliability degradation). For example, as the diameter of the channel hole decreases, the amount of reliability degradation may increase or it may be vulnerable to reliability degradation (e.g., the less the diameter of the channel hole, the larger the amount of reliability degradation or the more vulnerable to reliability degradation).

FIGS. 9, 10A, 10B and 10C are diagrams for describing a threshold voltage distribution associated with data stored in a nonvolatile memory device according to an example embodiment.

Figure 9:
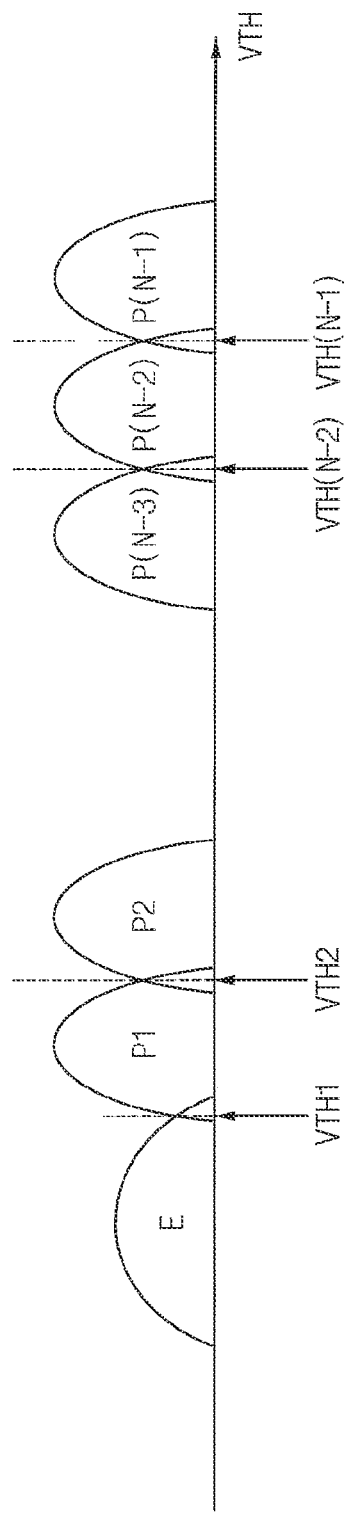
FIGS. 9, 10A, 10B and 10C are diagrams for describing a threshold voltage distribution associated with data stored in a nonvolatile memory device according to an example embodiment.

Referring to FIG. 9, an example of a threshold voltage distribution associated with at least one of a plurality of page data that are programmed in a plurality of pages is illustrated. As illustrated in FIG. 9, the threshold voltage distribution may include a plurality of states E, P1, P2, . . . , P(N−3), P(N−2), P(N−1), where N is a natural number. For example, the state E may represent an erase state, and the states P1 to P(N−1) may represent a plurality of program states.

In an example embodiment, a plurality of memory cells that are included in each page and store each page data include multi-level memory cells (MLCs) each of which stores two or more data bits. Hereinafter, the multi-level memory cell may be used as a term that includes not only a memory cell storing two data bits, but also a memory cell storing three data bits (e.g., a triple level memory cell (TLC)), a memory cell storing four data bits (e.g., a quad level memory cell (QLC)), or the like. For example, N=8 in a case of the triple level memory cell, and N=16 in a case of the quad level memory cell, however, example embodiments are not limited thereto. For example, the multi-level memory cells may be programmed using various program schemes, such as a shadow programming scheme, a reprogramming scheme or an on-chip buffered programming scheme.

In some example embodiments, a plurality of threshold voltages VTH1, VTH2, . . . , VTH(N−2), VTH(N−1) may be used to distinguish or determine the plurality of states E and P1 to P(N−1). For example, it may be distinguished using the threshold voltage VTH1 whether it is the erase state E or the program state P1, and it may be distinguished using the threshold voltage VTH2 whether it is the program state P1 or the program state P2. For example, when a read of memory cell corresponding to a plurality of bits is performed, the read returns a read voltage of the memory cells. The bits may have a value corresponding to an erase state when the read voltage is less than the first threshold voltage VTH1, the bits may have a value corresponding to a first programmed state P1 when the read voltage is between the first threshold voltage VTH1 and the second threshold voltage VTH2, etc.

Figure 10A:
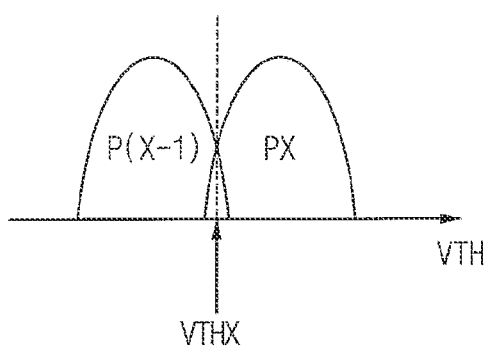
Figure 10B:
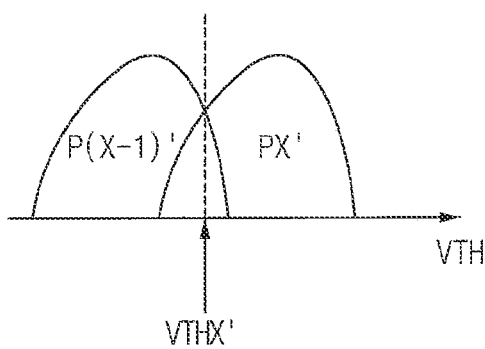
Figure 10C:
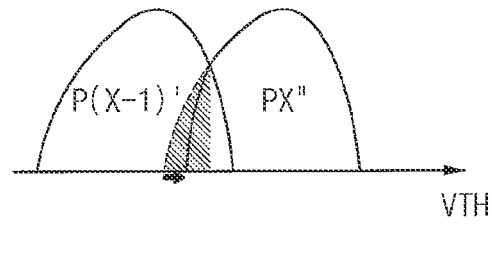

Referring to FIGS. 10A, 10B and 10C, an example of degradation or deterioration of a threshold voltage distribution and an example where the degradation of the threshold voltage distribution is compensated (e.g., reliability is restored) by the reprogram operation are illustrated. For convenience of illustration, only two adjacent states among the plurality of states E and P1 to P(N−1) in FIG. 9 are illustrated.

FIG. 10A illustrates a threshold voltage distribution immediately after data is programmed, e.g., an initial threshold voltage distribution. The initial threshold voltage distribution may include program states P(X−1) and PX, where X is a natural number greater than or equal to two. It may be distinguished using a threshold voltage VTHX whether it is the program state P(X−1) or the program state PX.

FIG. 10B illustrates that the initial threshold voltage distribution of FIG. 10A is degraded over time. The program states P(X−1) and PX in FIG. 10A may be changed to program states P(X−1)' and PX' in FIG. 10B, and thus the threshold voltage VTHX may be changed to the threshold voltage VTHX'. For example, in FIG. 10B, the lower bound of the voltage of the program state PX has been reduced to form the degraded program state PX'.

Typically, data may be written into a NAND flash memory by storing charges in a floating gate or a charge trap flash (CTF) of a memory cell and by changing a threshold voltage of the memory cell based on the stored charges. However, the stored charges may leak over time (e.g., charge loss), and thus the threshold voltage may be shifted, moved or changed. When the threshold voltage is shifted, an error may occur in the memory cell during a data read operation.

For example, a distribution of the program states may shift in a direction in which the threshold voltage decreases as memory cells included in the program states are discharged over time. In this case, a memory cell that is included in a specific program state (e.g., the program state PX') and has the lowest threshold voltage in the specific program state may overlap with a distribution of adjacent lower program state (e.g., the program states P(X−1)'), and then an error in which '1' and '0' are read in reverse may occur. In other words, most of error bits due to retention characteristics may be caused by the charge loss in a tail of the distribution.

FIG. 10C illustrates an example where the degraded threshold voltage distribution of FIG. 10B is compensated by performing the reprogram operation according to an example embodiment. A hatched area in FIG. 10C represents a threshold voltage distribution of memory cells whose values are changed after the error correction by the ECC decoding among memory cells corresponding to the program state PX' in FIG. 10B. The hatched area may be referred to as an error bit area EB.

When the program state PX' in FIG. 10B is compensated to the program state PX" in FIG. 10C by reprogramming only the memory cells corresponding to the error bit area EB, e.g., when a dotted line in FIG. 10C is compensated to a solid line in FIG. 10C, threshold voltages of the memory cells corresponding to the error bit area EB may increase, and thus the error may be reduced. In addition, only the memory cells corresponding to the error bit area EB may be selected and reprogrammed, and thus a side effect of increasing the maximum threshold voltage of the program state PX" may be prevented.

To minimize overprogramming of the error bit area EB and disturbance of the remaining areas in the program state PX' in FIG. 10B, the reprogram voltage having a relatively low voltage level should be used. However, if the voltage level of the reprogram voltage is too low, the threshold voltages of the memory cells corresponding to the error bit area EB may insignificantly increase, so that the error may not be greatly reduced.

In an example embodiment, the program states PX, PX' and PX" that are compensated by the reprogram operation may be the highest state P(N−1) among the plurality of states E and P1 to P(N−1) (e.g., X=N−1). For example, the compensated program state may be a P7 state in a case of the triple level memory cell, and may be a P15 state in a case of the quad level memory cell. For example, the degradation of the threshold voltage distribution in which the program state PX is changed to the program state PX' may be severe or worse as the threshold voltage is higher, and thus the degradation of the threshold voltage distribution may be compensated by performing the reprogram operation on the highest state P(N−1). However, example embodiments are not limited thereto. In another example, the reprogram operation may be performed on another state other than the highest state P(N−1), and/or two or more states among the plurality of states E and P1 to P(N−1).

FIGS. 11A, 11B, 11C and 11D are diagrams for describing a program operation and a reprogram operation performed in a nonvolatile memory device according to example embodiments.

Figure 11A:
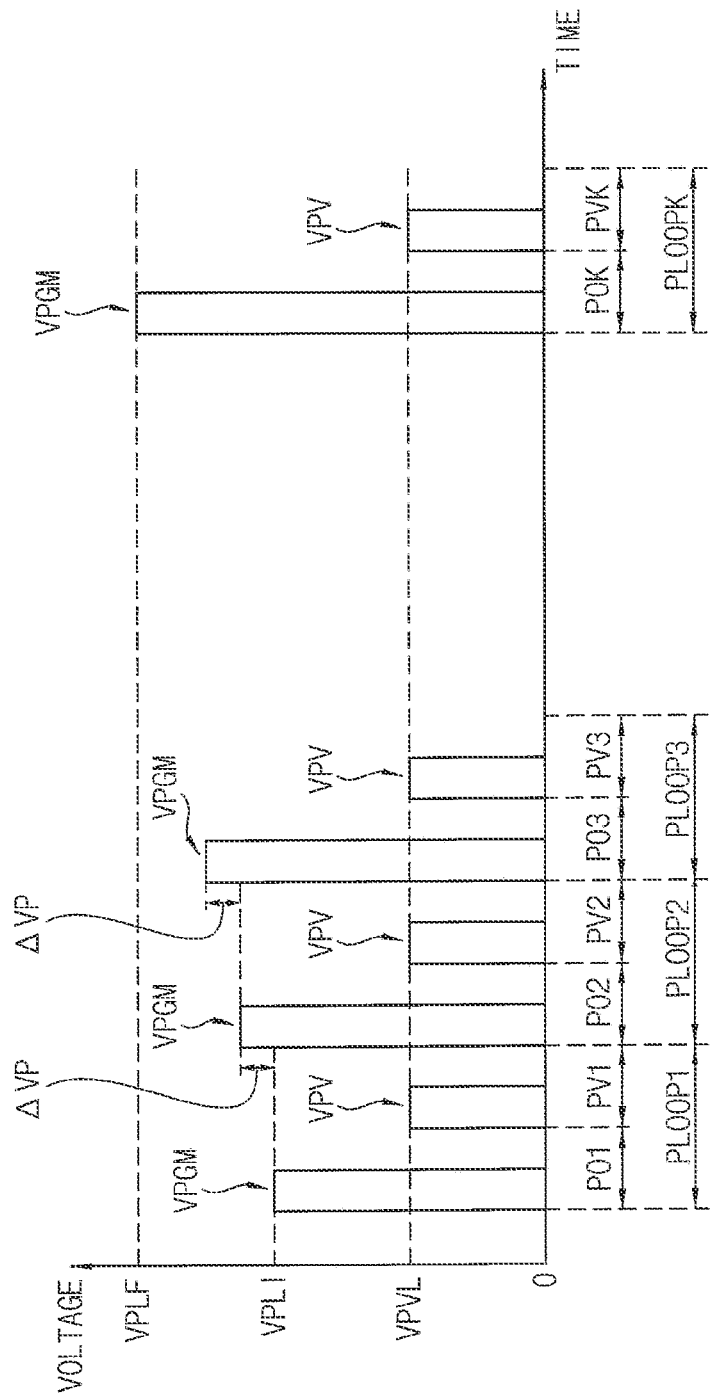
FIGS. 11A, 11B, 11C and 11D are diagrams for describing a program operation and a reprogram operation performed in a nonvolatile memory device according to an example embodiment.

Referring to FIG. 11A, the program operation may be performed based on an incremental step pulse program (ISPP) scheme.

For example, a plurality of program loops PLOOP1, PLOOP2, PLOOP3, . . . , PLOOPK may be sequentially performed, where K is a natural number greater than or equal to two. For each program loop, one of program operations PO1, PO2, PO3, . . . , POK using a program voltage VPGM and a respective one of program verification operations PV1, PV2, PV3, . . . , PVK using a program verification voltage VPV may be sequentially performed. When a program operation and a program verify operation in a specific program loop (e.g., in the program loop PLOOP3) are successfully completed, subsequent program loops (e.g., the program loop PLOOPK) may not be performed, and the process may be terminated.

In an example embodiment, a voltage level of the program voltage VPGM in a current program loop is higher than that of the program voltage VPGM in a previous program loop, and the program verification voltage VPV has a constant voltage level VPVL. For example, in the first program loop PLOOP1, the program voltage VPGM may have an initial voltage level VPLI. In the second program loop PLOOP2, the program voltage VPGM may have a voltage level that is increased by a step level ΔVP from the initial voltage level VPLI. In the third program loop PLOOP3, the program voltage VPGM may have a voltage level that is increased by the step level ΔVP from the voltage level of the program voltage VPGM in the second program loop PLOOP2. In the K-th program loop PLOOPK which is the last program loop, the program voltage VPGM may have a final voltage level VPLF.

Although FIG. 11A illustrates that only the voltage level of the program voltage VPGM increases as the program loops are repeatedly performed, example embodiments are not limited thereto, and the voltage level of the program verification voltage VPV may also increase. In addition, although FIG. 11A illustrates that the voltage level of the program voltage VPGM increases by a fixed level (e.g., the step level ΔVP) as the program loops are repeatedly performed, example embodiments are not limited thereto, and the amount of change in the program voltage VPGM may be changed for each program loop.

Figure 11B:
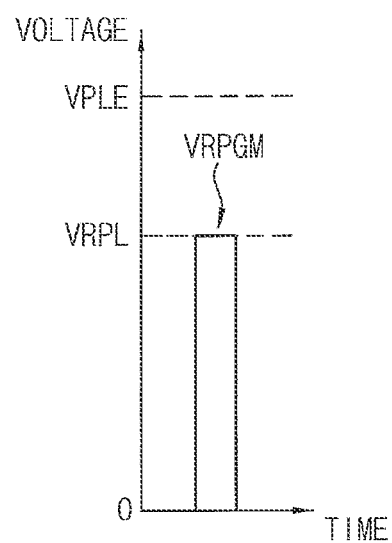

Referring to FIG. 11B, the reprogram operation may be performed based on a single pulse program scheme or a one-shot program scheme. For example, the reprogram operation may be performed once or one time using a reprogram voltage VRPGM having a voltage level VRPL. For example, the optimal voltage level for an appropriate reprogram operation may depend on various factors such as a location of a memory cell, a current lifespan of a memory cell, or the like, and thus it may be necessary to determine the voltage level VRPL of the reprogram voltage VRPGM in consideration of such various factors.

In an example embodiment, the voltage level VRPL of the reprogram voltage VRPGM is determined based on program loop completion information representing the number of times program loops are performed while data is programmed. In other words, the most appropriate voltage level VRPL of the reprogram voltage VRPGM at a current time may be calculated from the number of repetitions of the program loops while the corresponding original data is programmed. For example, as described with reference to FIG. 11A, when the program operation is performed based on the ISPP scheme, the program loops may be repeated while increasing the voltage level of the program voltage VPGM. In addition, when each state is programmed until a desired threshold voltage is reached, program loop completion information of each state may correspond to a program voltage for memory cells included in each state to reach the desired threshold voltage. Thus, the program loop completion information may be recorded while the program operation is performed, and then the voltage level VRPL of the reprogram voltage VRPGM may be calculated based on the program loop completion information.

For example, as the number of times program loops are performed while the data is programmed increases, the voltage level VRPL of the reprogram voltage VRPGM may be determined to increase. For example, the voltage level VRPL of the reprogram voltage VRPGM of a given state may be increased by a first amount when a first number of program loops are executed to achieve that first state and the voltage level VRPL may be increased by a second amount greater than the first amount when a second number of the program loops are executed that is greater than the first number to achieve the given state. As described with reference to FIG. 11A, as the program loops are repeated, the voltage level of the program voltage VPGM may increase, and thus the voltage level VRPL of the reprogram voltage VRPGM for the optimal reprogram operation may also increase.

For example, the voltage level VRPL of the reprogram voltage VRPGM may be determined to be lower than a voltage level VPLE of the program voltage VPGM at a time point at which the program operation on the data is completed. The voltage level VPLE may be referred to as a loop completion voltage level. For example, when the program loops are performed three times and then the program operation is successfully completed, VPLE=VPLI+2*ΔVP, and VRPL<VPLE=VPLI+2*ΔVP.

In an example embodiment, the voltage level VRPL of the reprogram voltage VRPGM is determined based on a shifted amount of threshold voltages due to a change in the threshold voltage distribution. In other words, the most appropriate voltage level VRPL of the reprogram voltage VRPGM at current time may be calculated by tracking the changed amount of the threshold voltages, and may be calculated from an initial threshold voltage when the corresponding original data is programmed and a current threshold voltage. For example, as described with reference to FIGS. 10A and 10B, a difference between the threshold voltage VTHX in the initial threshold voltage distribution and the threshold voltage VTHX' in the degraded threshold voltage distribution may be calculated as the shifted amount of threshold voltages. When the shifted amount of the threshold voltages is greater than a reference value, the voltage level VRPL of the reprogram voltage VRPGM may be determined based on the shifted amount of the threshold voltages.

For example, as the shifted amount of the threshold voltages increases, the voltage level VRPL of the reprogram voltage VRPGM may be determined to increase.

Figure 11C:
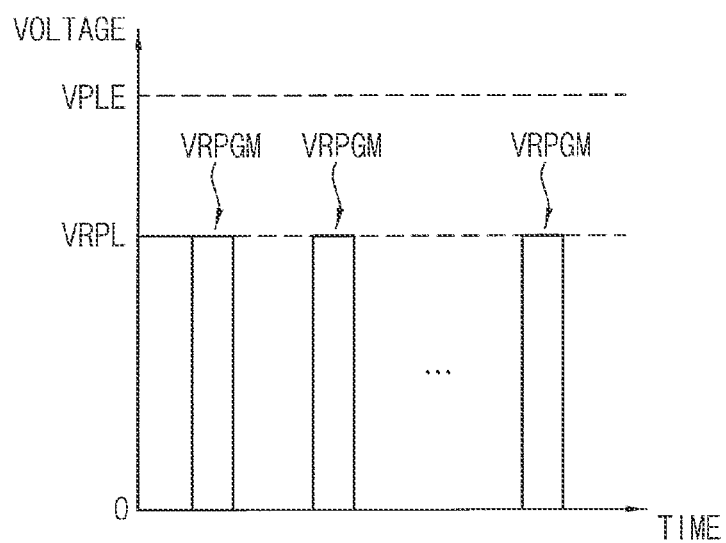

Referring to FIG. 11C, the reprogram operation may be performed based on a multiple pulse program scheme. For example, a plurality of reprogram operations may be performed using the reprogram voltage VRPGM having the voltage level VRPL. An example of FIG. 11C may be substantially the same as an example of FIG. 11B, except that a plurality of pulses are applied. The descriptions repeated with FIG. 11B will be omitted. Although not illustrated in detail, in some example embodiments, voltage levels of the plurality of pulses may be different from each other.

Figure 11D:
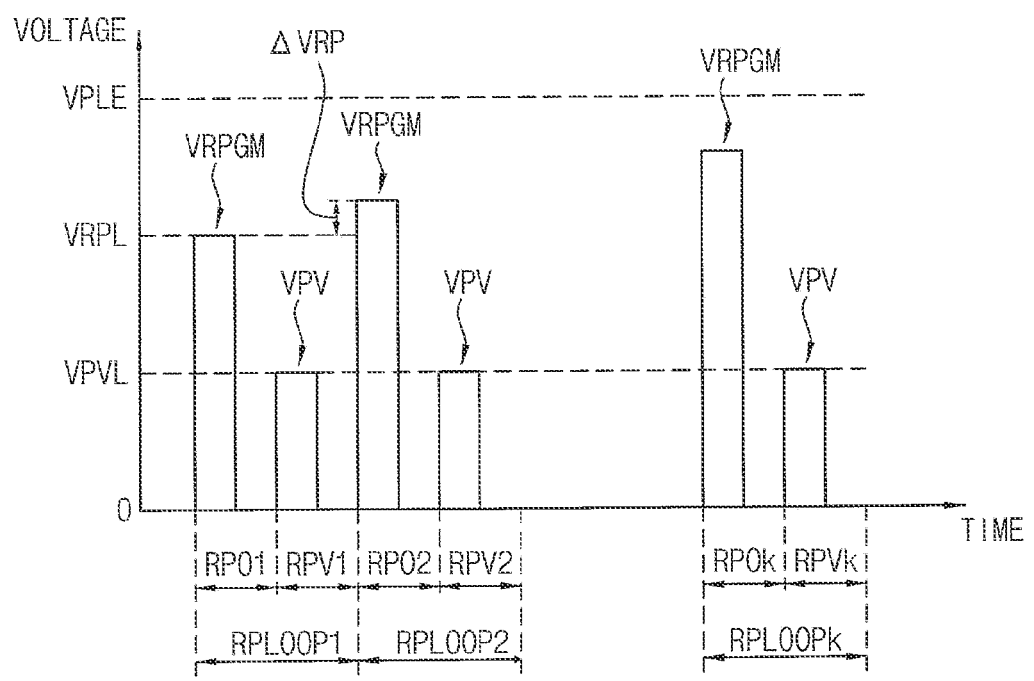

Referring to FIG. 11D, as with that described with reference to FIG. 11A, the reprogram operation may be performed based on the ISPP scheme. For example, a plurality of reprogram loops RPLOOP1, RPLOOP2, . . . , RPLOOPk may be sequentially performed, where k is a natural number greater than or equal to two. For each reprogram loop, one of reprogram operations RPO1, RPO2, . . . , RPOk using the reprogram voltage VPGM and a respective one of reprogram verification operations RPV1, RPV2, . . . , RPVk using the program verification voltage VPV may be sequentially performed. For example, the voltage level of the reprogram voltage VRPGM may increase by a step level ΔVRP as the reprogram loops are repeatedly performed. The reprogram loops in FIG. 11D may be similar to the program loops in FIG. 11A, and the reprogram voltage VRPGM in FIG. 11D may be similar to the reprogram voltage VRPGM in FIG. 11B. The descriptions repeated with FIGS. 11A and 11B will be omitted.

Figure 12:
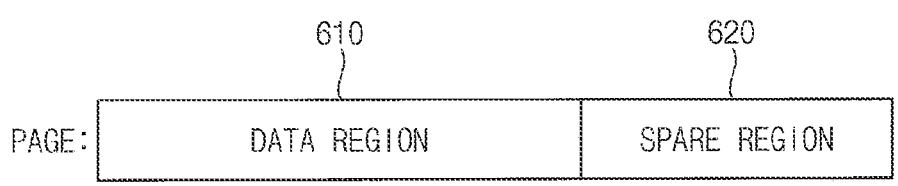
FIGS. 12, 13 and 14 are diagrams for describing pages included in a nonvolatile memory device according to an example embodiment.
Figure 13:
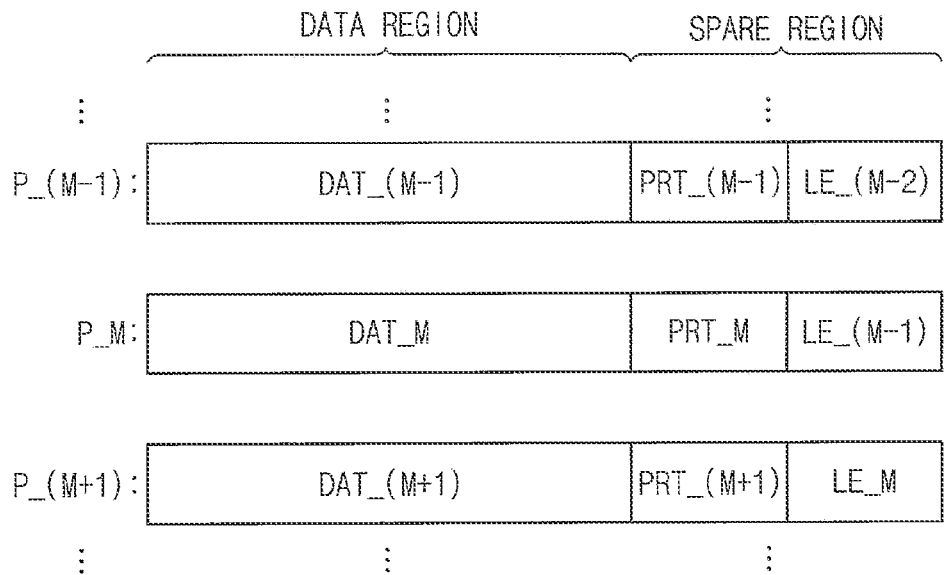
Figure 14:
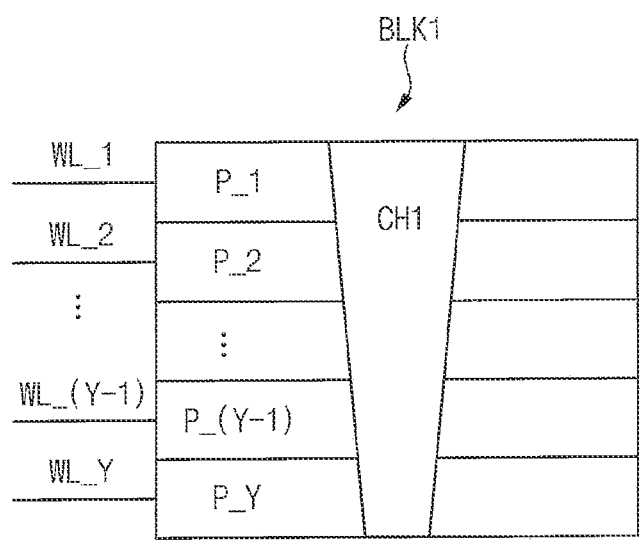

FIGS. 12, 13 and 14 are diagrams for describing pages included in a nonvolatile memory device according to example embodiments.

Referring to FIG. 12, each page may include a data region 610 and a spare region 620. For example, each of the pages may include the data regions 610 having the same size and the spare regions 620 having the same size.

The data region 610 may be a region in which page data is stored, and the page data stored in the data region 610 may be actual data such as user data. The spare region 620 may be a region in which parity data associated with the page data is stored and program loop completion information according to an example embodiment is stored. The spare region 620 may be referred to as a parity region. For example, the parity data may be obtained by performing an ECC encoding on the page data. For example, the program loop completion information may be obtained after a program operation on the page data has completed. For example, the ECC engine 30 and the reprogram controller 40 included in the memory controller 20 may generate the parity data and the program loop completion information, respectively.

Referring to FIG. 13, an example of page data DAT_(M−1), DAT_M and DAT_(M+1), parity data PRT_(M−1), PRT_M and PRT_(M+1), and program loop completion information LE_(M−2), LE_(M−1) and LE_M that are stored in pages P_(M−1), P_M and P_(M+1), respectively, is illustrated, where M is a natural number greater than or equal to two.

The pages P_(M−1), P_M and P_(M+1) may be sequentially programmed. For example, the page P_(M−1) may be programmed, and then the page P_M may be programmed, and then the page P_(M+1) may be programmed.

In an example embodiment, program loop completion information stored in a current page that is currently programmed may be previous program loop completion information representing the number of times program loops are performed while a previous page that is previously programmed is programmed. In addition, current program loop completion information representing the number of times program loops are performed while the current page is programmed may be stored in a next page to be programmed.

For example, when the page P_(M−1) is programmed, the page data DAT_(M−1) may be stored in the data region 610 of the page P_(M−1), and the parity data PRT_(M−1) corresponding to page data DAT_(M−1) and the program loop completion information LE_(M−2) may be stored in the spare region 620 of the page P_(M−1). At a time point at which the program operation on the page P_(M−1) is started, the number of times program loops are performed while the page P_(M−1) is programmed may not be known in advance, and thus the program loop completion information LE_(M−2) representing the number of times program loops are performed while a previously programmed page is programmed may be stored in the spare region 620 of the page P_(M−1). The program loop completion information LE_(M−1) representing the number of times program loops are performed while the page P_(M−1) is programmed may be checked or known after the program operation on the page P_(M−1) has successfully completed.

After that, when the page P_M is programmed, the page data DAT_M may be stored in the data region 610 of the page P_M, and the parity data PRT_M corresponding to the page data DAT_M and the program loop completion information LE_(M−1) representing the number of times program loops are performed while the page P_(M−1) is programmed may be stored in the spare region 620 of the page P_M. As described above, the program loop completion information LE_M representing the number of times program loops are performed while the page P_M is programmed may be checked after the program operation on the page P_M has successfully completed.

After that, when the page P_(M+1) is programmed, the page data DAT_(M+1) may be stored in the data region 610 of the page P_(M+1), and the parity data PRT_(M+1) corresponding to the page data DAT_(M+1) and the program loop completion information LE_M representing the number of times program loops are performed while the page P_M is programmed may be stored in the spare region 620 of the page P_(M+1).

In an example embodiment, only a part of numbers corresponding to the program loop completion information LE_(M−2), LE_(M−1) and LE_M is stored in the spare region 620. Typically, the number of times program loops are performed is expected to be included within a certain number range, and thus some bits of the number corresponding to the program loop completion information may be omitted and only the remaining bits may be stored. For example, when the number of times program loops are performed is expected to be about 8, 9, 10 or 11 times, '8', '9', '10' and '11' in decimal may be converted to '1000', '1001', '1010' and '1011' in binary, respectively, and thus '10', which is the upper two bits, may be omitted or deleted and only '00', '01', '10' and '11' may be stored in the spare region 620. For example, when the program loop completion information stored in the spare region 620 is '01', it may be determined that the number of times program loops are performed is 9 times.

In an example embodiment, the ISPP scheme described with reference to FIG. 11A is performed for each of the plurality of program states (e.g., the program states P1 to P(N−1) in FIG. 9). The number of times the program loops are performed for a specific state in which the reprogram operation is performed (e.g., the highest state (P(N−1)) among the plurality of program states may be stored as the program loop completion information LE_(M−2), LE_(M−1) and LE_M.

Referring to FIG. 14, an example of pages P_1, P_2, . . . , P_(Y−1), P_Y included in a vertical (or three-dimensional) memory cell array is illustrated, where Y is a natural number greater than or equal to two.

The pages P_1 to P_Y may be included in a first memory block BLK1, and may be sequentially arranged along a vertical direction, e.g., along a first channel hole CHI included in the first memory block BLK1. In addition, the pages P_1 to P_Y may be connected to wordlines WL_1, WL_2, . . . , WL_(Y−1), WL_Y, respectively.

In some example embodiments, as the diameter of the channel hole increases, the amount of reliability degradation may decrease or it may be robust against reliability degradation. Thus, the upper wordlines WL_1 and WL_2 may be wordlines having a degree of reliability degradation less than (or expected to be less than) a reference value. In other words, the upper wordlines WL_1 and WL_2 may represent wordlines in which the amount of reliability degradation is relatively small or wordlines that are relatively robust against reliability degradation. The upper wordlines WL_1 and WL_2 and the pages P_1 and P_2 connected thereto may be referred to as strong wordlines and strong pages with relatively less charge loss. In addition, as the diameter of the channel hole decreases, the amount of reliability degradation may increase or it may be vulnerable to reliability degradation. Thus, the lower wordlines WL_(Y−1) and WL_Y may be wordlines having a degree of reliability degradation greater than or equal to (or expected to be greater than or equal to) the reference value. In other words, the lower wordlines WL_(Y−1) and WL_Y may represent wordlines in which the amount of reliability degradation is relatively large or wordlines that are relatively vulnerable to reliability degradation. The lower wordlines WL_(Y−1) and WL_Y and the pages P_(Y−1) and P_Y connected thereto may be referred to as weak wordlines and weak pages with relatively large charge loss.

In an example embodiment, the reprogram operation is performed on the lower wordlines WL_(Y−1) and WL_Y and the pages P_(Y−1) and P_Y connected thereto. In an example embodiment, the number of times (or frequency) of performing the reprogram operation on the lower wordlines WL_(Y−1) and WL_Y and the pages P_(Y−1) and P_Y connected thereto is larger than the number of times (or frequency) of performing the reprogram operation on the upper wordlines WL_1 and WL_2 and the pages P_1 and P_2 connected thereto.

Wordlines included in a vertical (or three-dimensional) memory cell array may have different charge loss rates. An erase operation may be performed by units of memory blocks due to a characteristic of a NAND flash memory. When a wordline most vulnerable to reliability degradation reaches a reliability limit, the entire memory block may be erased and rewritten. In this case, the remaining wordlines in the memory block that do not reach the reliability limit may also be erased and rewritten, and thus there may be a problem in that a write amplification factor (WAF) increases. In contrast, when the reprogram operation is performed only on the wordline that has reached the reliability limit due to the high charge loss rate according to an example embodiment, the nonvolatile memory device may have enhanced performance.

Figure 15:
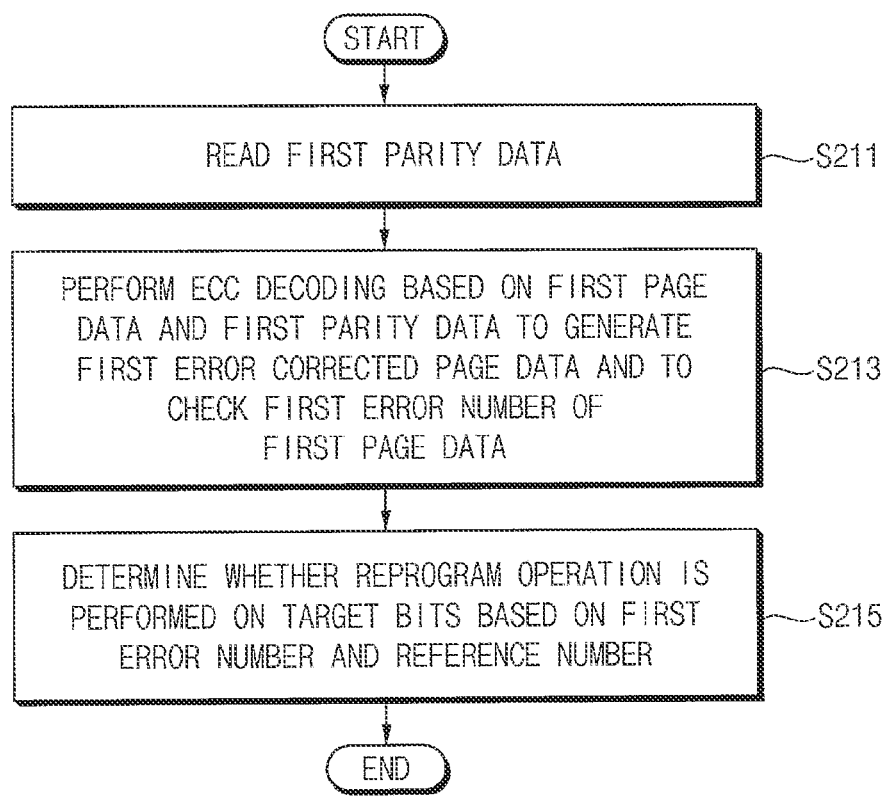
FIG. 15 is a flowchart illustrating an example of performing an ECC decoding on first page data in FIG. 2.

FIG. 15 is a flowchart illustrating an example of performing an ECC decoding on first page data in FIG. 2 according to an example embodiment.

Referring to FIGS. 2 and 15, in step S210, first parity data corresponding to the first page data is read (step S211). For example, the first page data and the first parity data may be stored in a first data region and a first spare region in the first page, respectively. When the first page is read, the first page data and the first parity data may be obtained together. In other words, step S211 may be performed substantially simultaneously with step S110 in FIG. 2.

The ECC decoding is performed based on the first page data and the first parity data to generate first error corrected page data and to check a first error number of the first page data (step S213). The first error number may represent the number of errors in the first page data. It is determined, based on the first error number and a reference number, whether the reprogram operation is to be performed on the target bits (step S215).

Figure 16:
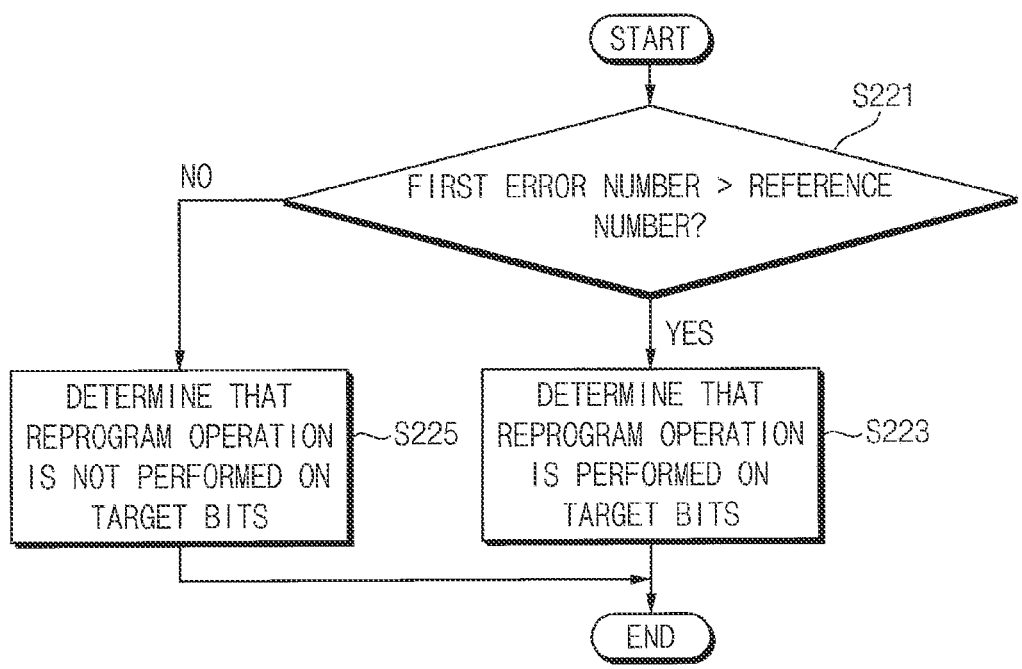
FIG. 16 is a flowchart illustrating an example of determining whether a reprogram operation is performed on target bits in FIG. 15.

FIG. 16 is a flowchart illustrating an example of determining whether a reprogram operation is performed on target bits in FIG. 15 according to an example embodiment.

Referring to FIGS. 15 and 16, in step S215, when the first error number is greater than the reference number (step S221: YES), it is determined that the reprogram operation is to be performed on the target bits (step S223). When the first error number is less than or equal to the reference number (step S221: NO), it is determined that the reprogram operation is not to be performed on the target bits (step S225).

Figure 17:
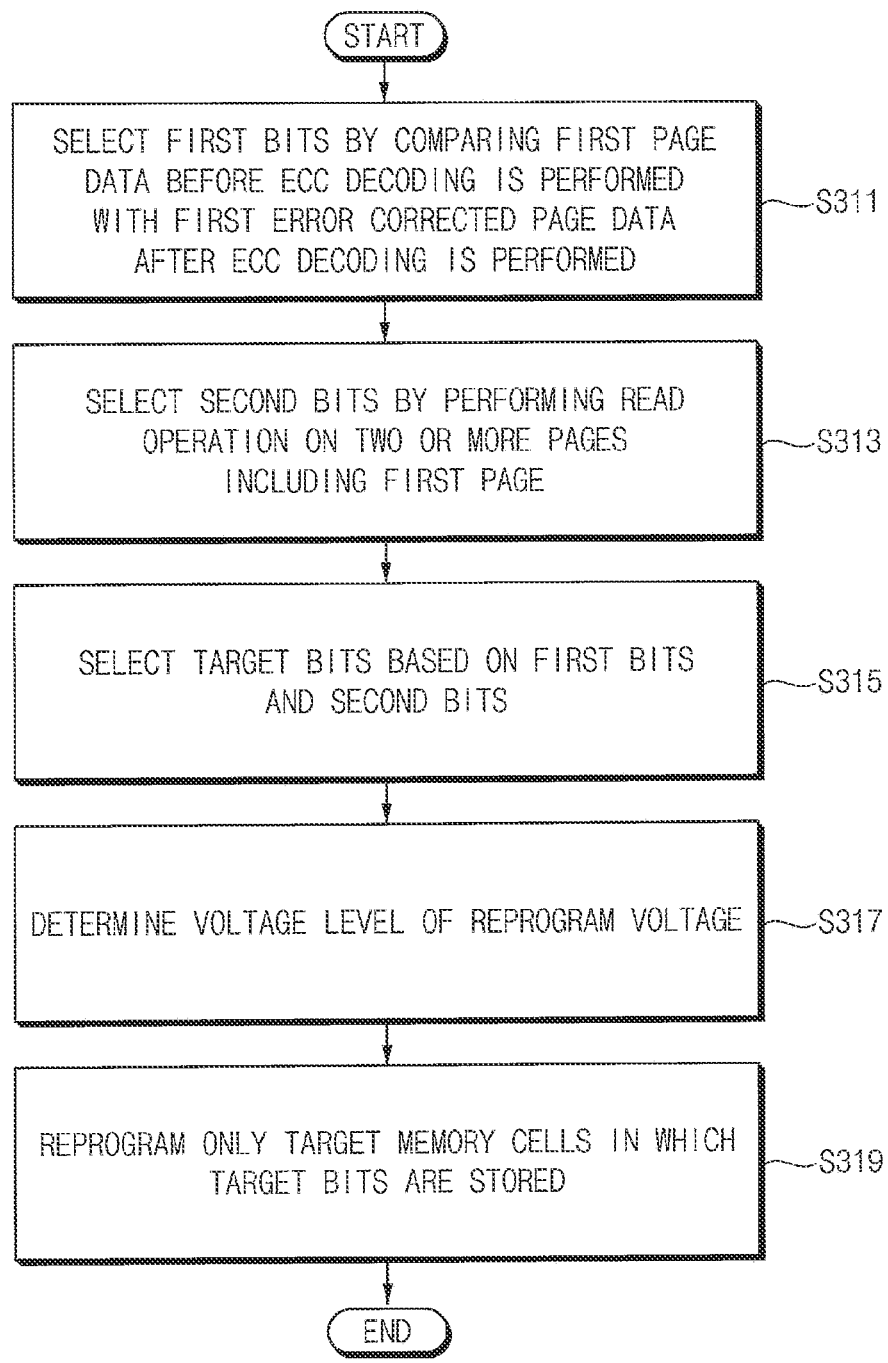
FIG. 17 is a flowchart illustrating an example of performing a reprogram operation on target bits in FIG. 2.

FIG. 17 is a flowchart illustrating an example of performing a reprogram operation on target bits in FIG. 2 according to an example embodiment.

Referring to FIGS. 2 and 17, in step S310, first bits in which an error occurs is selected from among the plurality of bits by comparing the first page data before the ECC decoding is performed with the first error corrected page data after the ECC decoding is performed (step S311). Second bits corresponding to the first state are selected from among the plurality of bits by performing a read operation on two or more pages including the first page among the plurality of pages (step S313). For example, in the multi-level memory cells, two or more pages may be read to determine a specific state. For example, the first state may be the highest state (e.g., P(N−1) in FIG. 9).

The target bits are selected based on the first bits and the second bits (step S315). For example, the target bits may be a part of the first bits and a part of the second bits. For example, the target bits may correspond to the error bit area EB in FIG. 10C. In an embodiment, the second bits indicate which of the first bits is associated with the first state, and the target bits are only the first bits associated with the first state.

The voltage level of the reprogram voltage is determined (step S317).

In an example embodiment, the voltage level of the reprogram voltage is determined based on the program loop completion information (e.g., LE_(M−2), LE_(M−1) and LE_M in FIG. 13). For example, when the first state corresponds to the highest state P(N−1), the number of times program loops are performed for the highest state P(N−1) may be stored as the program loop completion information LE_(M−2), LE_(M−1) and LE_M.

For example, when the target bits are stored in the page P_M in FIG. 13, the voltage level of the reprogram voltage for performing the reprogram operation on the target bits may be determined based on the program loop completion information LE_M representing the number of times program loops are performed while the page P_M is programmed. In this example, since the program loop completion information LE_M is stored in the page P_(M+1) in FIG. 13, a read operation on the page P_(M+1) may be additionally required.

In another example, when the target bits are stored in the page P_M in FIG. 13, the voltage level of the reprogram voltage for performing the reprogram operation on the target bits may be determined based on the program loop completion information LE_(M−1) representing the number of times program loops are performed while the page P_(M−1) is programmed. In this example, since the program loop completion information LE_(M−1) is stored in the page P_M, an additional read operation other than the read operation on the page P_M may not be required. Adjacent pages may be expected to have a similar number of times of program loops, and thus the voltage level of the reprogram voltage may be determined using the program loop completion information LE_(M−1).

In an example embodiment, the voltage level of the reprogram voltage is determined based on the shifted amount of the threshold voltages (e.g., the difference between the threshold voltage VTHX in FIG. 10A and the threshold voltage VTHX' in FIG. 10B).

In an example embodiment, the voltage level of the reprogram voltage is determined based on both the program loop completion information and the shifted amount of the threshold voltages.

Only target memory cells in which the target bits are stored are reprogrammed by applying the reprogram voltage only to the target memory cells (step S319). For example, the reprogram voltage may be applied to the target memory cells one time as described with reference to FIG. 11B, the reprogram voltage may be applied to the target memory cells multiple times as described with reference to FIG. 11C, or the plurality of reprogram loops may be performed as described with reference to FIG. 11D.

Figure 18:
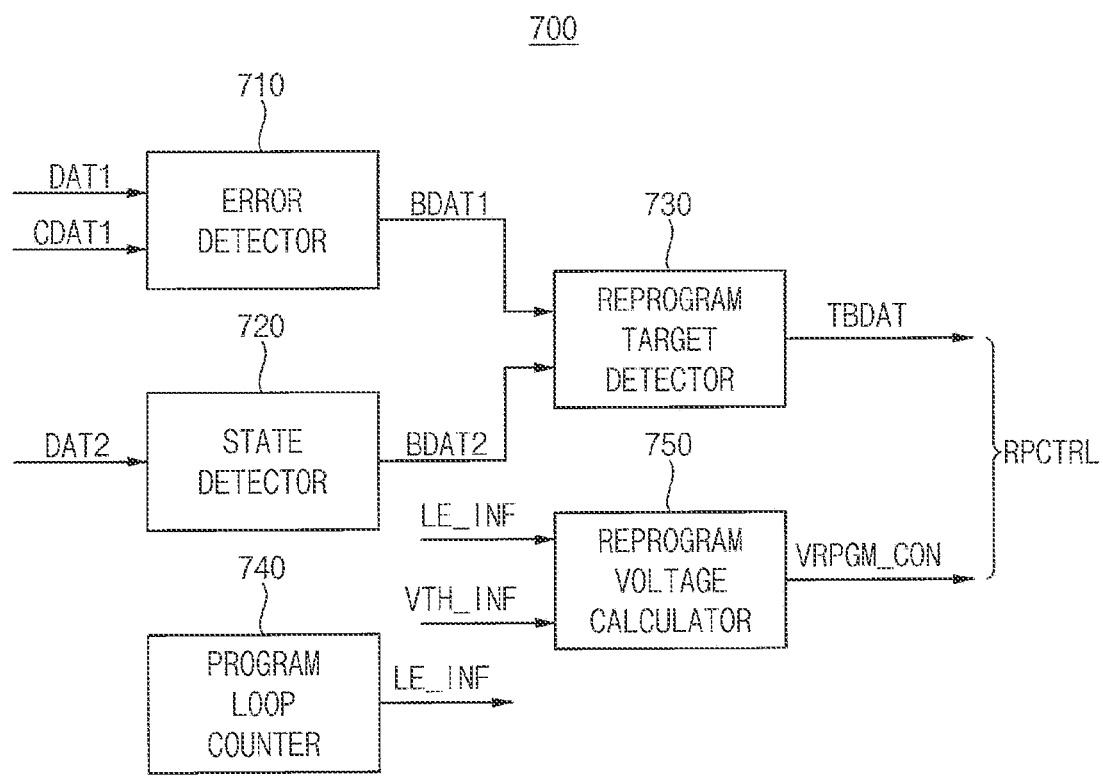
FIG. 18 is a block diagram illustrating an example of a reprogram controller included in a memory system of FIG. 3.

FIG. 18 is a block diagram illustrating an example of a reprogram controller included in a memory system of FIG. 3 according to an example embodiment.

Referring to FIG. 18, a reprogram controller 700 may include an error detector 710, a state detector 720, a reprogram target detector 730, a program loop counter 740 and a reprogram voltage calculator 750. The reprogram controller 700 may be used to implement the reprogram controller 40 of FIG. 3.

The error detector 710 may select first bits BDAT1 by comparing first page data DAT1 with first error corrected page data CDAT1, and may perform step S311 in FIG. 17. The first bits BDAT1 may be bits of the first page data DAT1 having an error. The state detector 720 may select second bits BDAT2 based on data DAT2 obtained by performing a read operation on two or more pages, and may perform step S313 in FIG. 17. The second bits BDAT2 may be bits having the first state. The reprogram target detector 730 may select target bits TBDAT based on the first bits BDAT1 and the second bits BDAT2, and may perform step S315 in FIG. 17.

For example, the reprogram target detector 730 may select some of the first bits BDAT1 having the first state as the target bits TBDAT using the second bits BDATA2. The reprogram voltage calculator 750 may calculate the voltage level of the reprogram voltage based on at least one of first information LE_INF and second information VTH_INF, and may generate a reprogram voltage control signal VRPGM_CON based on the calculated voltage level of the reprogram voltage, and may perform step S317 in FIG. 17. The first information LE_INF may include the program loop completion information, and the second information VTH_INF may include the shifted amount of the threshold voltages. The target bits TBDAT and the reprogram voltage control signal VRPGM_CON may be included in the reprogram control signal RPCTRL.

The program loop counter 740 may generate the first information LE_INF by counting the number of times the program loops are performed. As described with reference to FIG. 13, the first information LE_INF may be stored in each page of the nonvolatile memory device.

Figure 19:
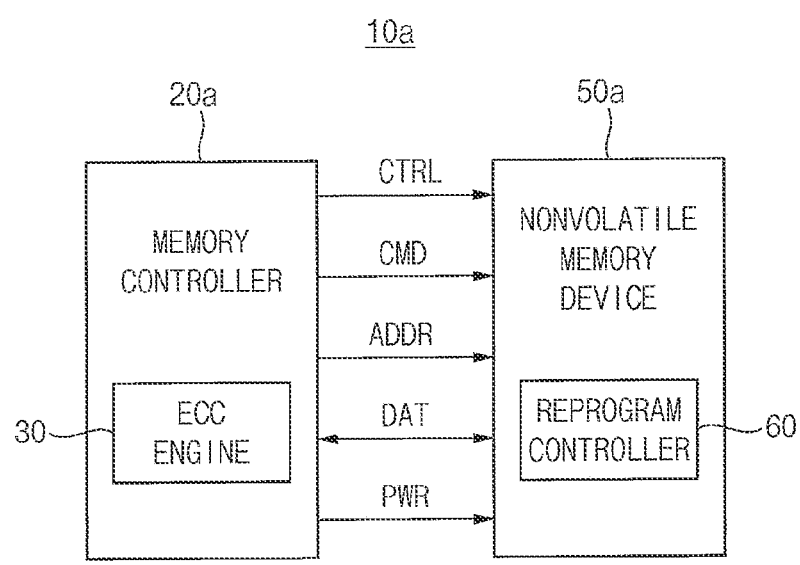
FIG. 19 is a block diagram illustrating a memory system including a nonvolatile memory device according to an example embodiment.

FIG. 19 is a block diagram illustrating a memory system including a nonvolatile memory device according to example embodiments. The descriptions repeated with FIG. 3 will be omitted.

Referring to FIG. 19, a memory system 10a includes a memory controller 20a and a nonvolatile memory device 50a.

The memory system 10a of FIG. 19 may be substantially the same as the memory system 10 of FIG. 3, except that the reprogram controller 40 is omitted and the nonvolatile memory device 50a includes a reprogram controller 60. The reprogram controller 60 in FIG. 19 may be substantially the same as the reprogram controller 40 in FIG. 3.

Figure 20:
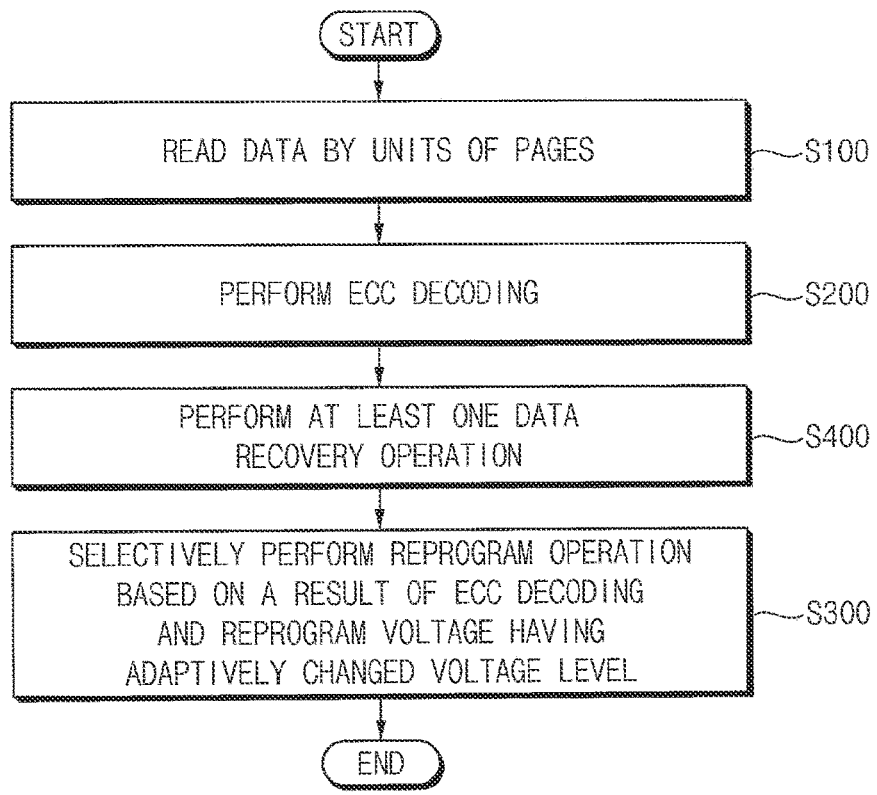
FIGS. 20 and 21 are flowcharts illustrating a method of reprogramming data in a nonvolatile memory device according to an example embodiment.
Figure 21:
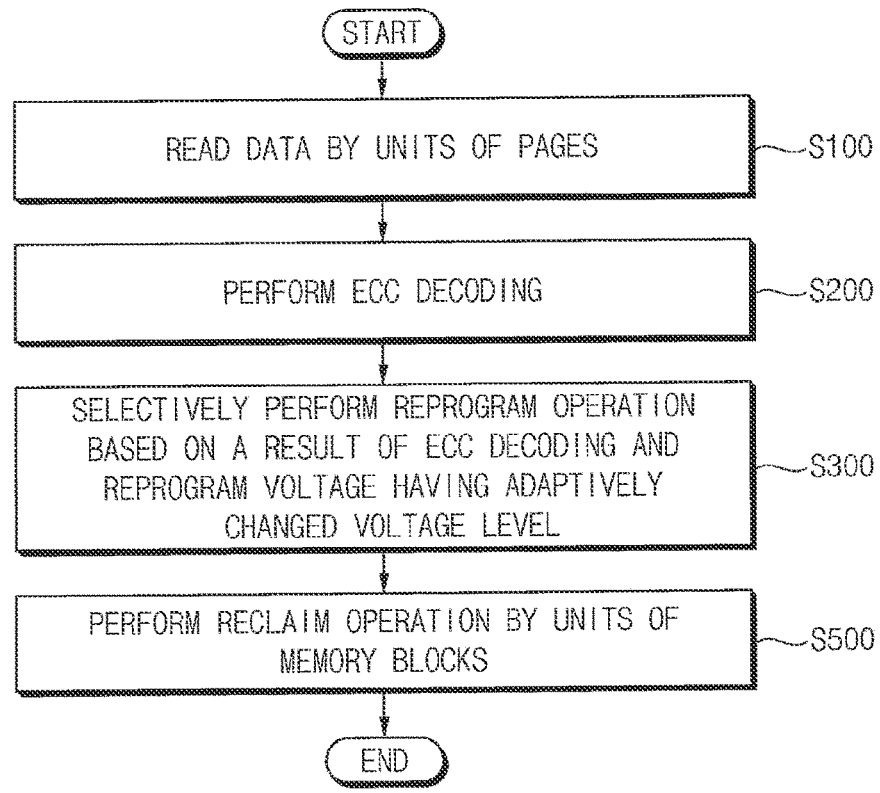

FIGS. 20 and 21 are flowcharts illustrating a method of reprogramming data in a nonvolatile memory device according to example embodiments. The descriptions repeated with FIG. 1 will be omitted.

Referring to FIGS. 20 and 21, in a method of reprogramming data in a nonvolatile memory device according to example embodiments, steps S100, S200 and S300 may be substantially the same as those described with reference to FIG. 1.

In the method of reprogramming data in the nonvolatile memory device of FIG. 20, at least one data recovery operation is performed on the data read in step S100 (step S400). For example, the at least one data recovery operation may be performed on the first page read in step S110 in FIG. 2. For example, the at least one data recovery operation may include a first data recovery operation (e.g., a performance defense code) performed within a predetermined time range even if the correction performance is relatively low, a second data recovery operation (e.g., a lifespan defense code) performed with relatively high correction performance even if it is performed out of the predetermined time range, or the like.

In the method of reprogramming data in the nonvolatile memory device of FIG. 21, a reclaim operation is performed by units of memory blocks (step S500). For example, in the reclaim operation, data programmed in a first memory block including the first page may be copied and may be programmed to a second memory block different from the first memory block. For example, step S500 may be performed when the first memory block is in an uncorrectable ECC (UECC) state.

In an example embodiment, both steps S400 and S500 are performed.

Figure 22:
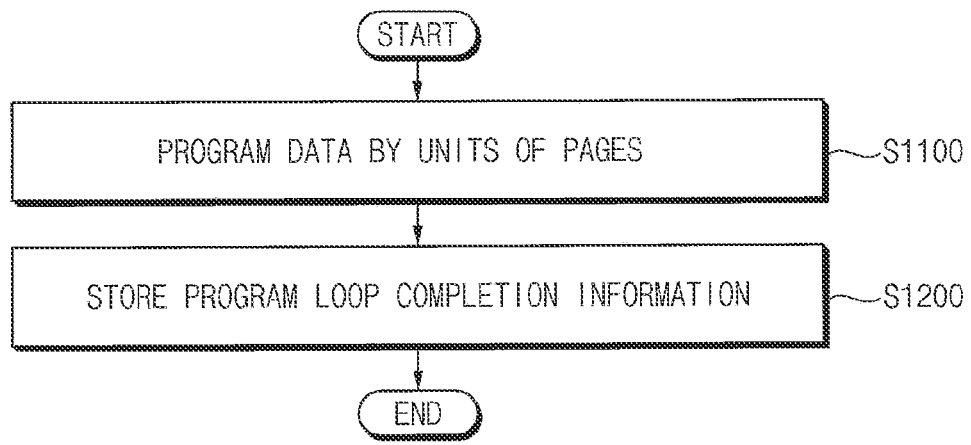
FIG. 22 is a flowchart illustrating a method of programming data in a nonvolatile memory device according to an example embodiment.

FIG. 22 is a flowchart illustrating a method of programming data in a nonvolatile memory device according to an example embodiment. The descriptions repeated with FIG. 1 will be omitted.

Referring to FIG. 22, in a method of programming data in a nonvolatile memory device according to an example embodiment, data is programmed by units of pages (step S1100), and program loop completion information is stored by units of pages (step S1200).

Figure 23:
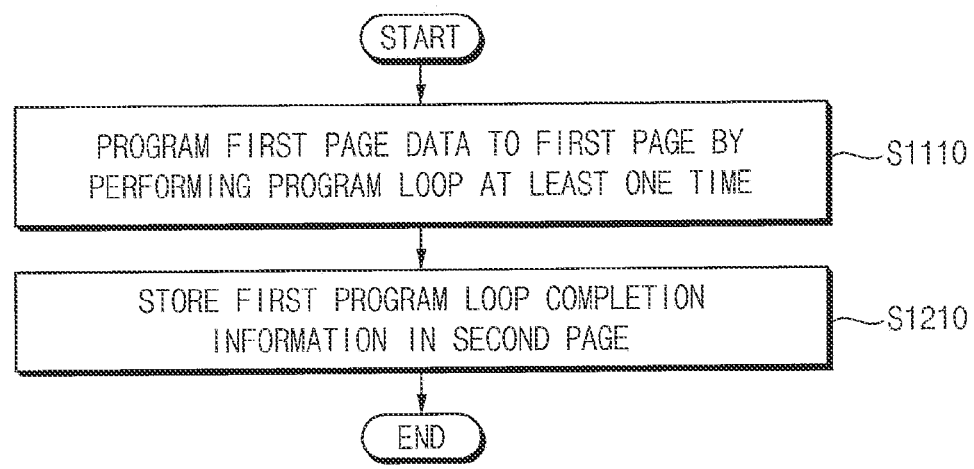
FIG. 23 is a flowchart illustrating an example of a method of programming data in a nonvolatile memory device of FIG. 22.

FIG. 23 is a flowchart illustrating an example of a method of programming data in a nonvolatile memory device of FIG. 22 according to an example embodiment. The descriptions repeated with FIG. 22 will be omitted.

Referring to FIGS. 22 and 23, first page data is programmed to a first page among the plurality of pages by performing a program loop including a program operation and a program verification operation at least one time (step S1110). The program operation is performed based on a program voltage, and the program verification operation is performed based on a program verification voltage. A voltage level of the program voltage is changed or variable. First program loop completion information representing the number of times program loops are performed while the first page data is programmed is stored in a second page different from the first page (step S1210). For example, the first page data and the first program loop completion information may be stored as described with reference to FIG. 13.

Figure 24:
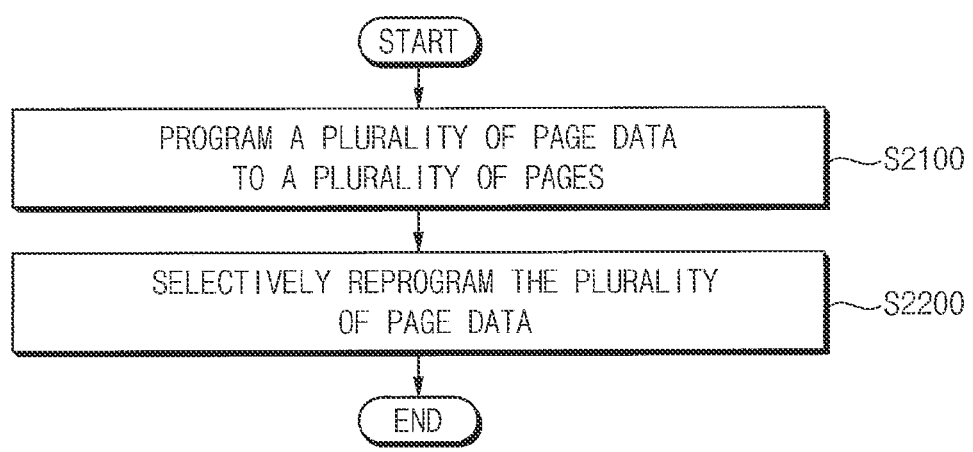
FIG. 24 is a flowchart illustrating a method of operating a nonvolatile memory device according to an example embodiment.

FIG. 24 is a flowchart illustrating a method of operating a nonvolatile memory device according to an example embodiment.

Referring to FIG. 24, in a method of operating a nonvolatile memory device according to an example embodiment, a plurality of page data are programmed to the plurality of pages (step S2100), and the plurality of page data are selectively reprogrammed (step S2200). Step S2100 may be performed based on the method of programming data according to an example embodiment, and step S2200 may be performed based on the method of reprogramming data according to an example embodiment.

Figure 25:
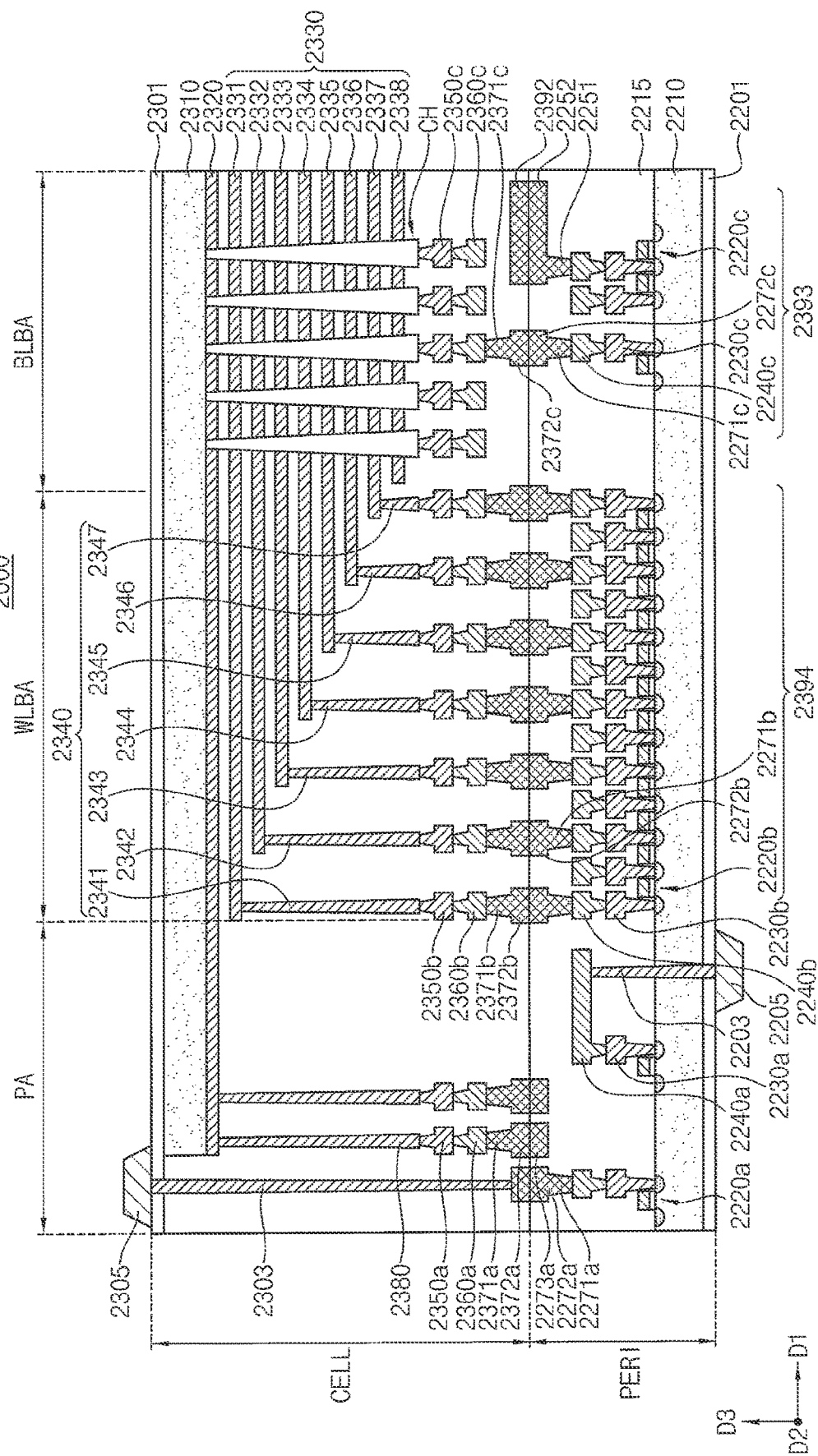
FIG. 25 is a cross-sectional view of a nonvolatile memory device according to an example embodiment.

FIG. 25 is a cross-sectional view of a nonvolatile memory device according to an example embodiment.

Referring to FIG. 25, a nonvolatile memory device or a memory device 2000 may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, is not limited thereto. For example, the bonding metals may also be formed of aluminum (Al) or tungsten (W).

Each of the peripheral circuit region PERI and the cell region CELL of the memory device 2000 may include an external pad bonding area PA, a wordline bonding area WLBA, and a bitline bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an example embodiment illustrate in FIG. 25, although only the first metal layers 2230a, 2230b, and 2230c and the second metal layers 2240a, 2240b, and 2240c are shown and described, the example embodiment is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of wordlines 2331, 2332, 2333, 2334, 2335, 2336, 2337, and 2338 (i.e., 2330) may be stacked in a third direction D3 (e.g., a Z-axis direction), perpendicular to an upper surface of the second substrate 2310. At least one string selection line and at least one ground selection line may be arranged on and below the plurality of wordlines 2330, respectively, and the plurality of wordlines 2330 may be disposed between the at least one string selection line and the at least one ground selection line.

In the bitline bonding area BLBA, a channel structure CH may extend in the third direction D3 (e.g., the Z-axis direction), perpendicular to the upper surface of the second substrate 2310, and pass through the plurality of wordlines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bitline contact, and the second metal layer 2360c may be a bitline. In an example embodiment, the bitline 2360c may extend in a second direction D2 (e.g., a Y-axis direction), parallel to the upper surface of the second substrate 2310.

In an example embodiment illustrated in FIG. 25, an area in which the channel structure CH, the bitline 2360c, and the like are disposed may be defined as the bitline bonding area BLBA. In the bitline bonding area BLBA, the bitline 2360*c* may be electrically connected to the circuit elements 2220*c* providing a page buffer 2393 in the peripheral circuit region PERI. The bitline 2360*c* may be connected to upper bonding metals 2371*c* and 2372*c* in the cell region CELL, and the upper bonding metals 2371*c* and 2372*c* may be connected to lower bonding metals 2271*c* and 2272*c* connected to the circuit elements 2220*c* of the page buffer 2393.

In the wordline bonding area WLBA, the plurality of wordlines 2330 may extend in a first direction D1 (e.g., an X-axis direction), parallel to the upper surface of the second substrate 2310 and perpendicular to the second direction D2, and may be connected to a plurality of cell contact plugs 2341, 2342, 2343, 2344, 2345, 2346, and 2347 (i.e., 2340). The plurality of wordlines 2330 and the plurality of cell contact plugs 2340 may be connected to each other in pads provided by at least a portion of the plurality of wordlines 2330 extending in different lengths in the first direction D1. A first metal layer 2350*b* and a second metal layer 2360*b* may be connected to an upper portion of the plurality of cell contact plugs 2340 connected to the plurality of wordlines 2330, sequentially. The plurality of cell contact plugs 2340 may be connected to the peripheral circuit region PERI by the upper bonding metals 2371*b* and 2372*b* of the cell region CELL and the lower bonding metals 2271*b* and 2272*b* of the peripheral circuit region PERI in the wordline bonding area WLBA.

The plurality of cell contact plugs 2340 may be electrically connected to the circuit elements 2220*b* forming a row decoder 2394 in the peripheral circuit region PERI. In an example embodiment, operating voltages of the circuit elements 2220*b* forming the row decoder 2394 may be different than operating voltages of the circuit elements 2220*c* forming the page buffer 2393. For example, operating voltages of the circuit elements 2220*c* forming the page buffer 2393 may be greater than operating voltages of the circuit elements 2220*b* forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350*a* and a second metal layer 2360*a* may be stacked on an upper portion of the common source line contact plug 2380, sequentially. For example, an area in which the common source line contact plug 2380, the first metal layer 2350*a*, and the second metal layer 2360*a* are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220*a*, 2220*b*, and 2220*c* disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220*a*, 2220*b*, and 2220*c* disposed in the peripheral circuit region PERI through a second input/output contact plug 2303. In the example embodiment, the second input/output pad 2305 is electrically connected to a circuit element 2220*a*.

According to an embodiment, the second substrate 2310 and the common source line 2320 are not disposed in an area in which the second input/output contact plug 2303 is disposed. In an embodiment, the second input/output pad 2305 does not overlap the wordlines 2330 in the third direction D3 (e.g., the Z-axis direction). The second input/output contact plug 2303 may be separated from the second substrate 2310 in the direction, parallel to the upper surface of the second substrate 310, and may pass through the interlayer insulating layer 2315 of the cell region CELL to be connected to the second input/output pad 2305.

According to embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. Alternatively, the memory device 200 may include both the first input/output pad 2205 and the second input/output pad 2305.

A metal pattern provided on an uppermost metal layer may be provided as a dummy pattern or the uppermost metal layer may be absent, in each of the external pad bonding area PA and the bitline bonding area BLBA, respectively included in the cell region CELL and the peripheral circuit region PERI.

In the external pad bonding area PA, the memory device 2000 may include a lower metal pattern 2273*a*, corresponding to an upper metal pattern 2372*a* formed in an uppermost metal layer of the cell region CELL, and having the same cross-sectional shape as the upper metal pattern 2372*a* of the cell region CELL so as to be connected to each other, in an uppermost metal layer of the peripheral circuit region PERI. In the peripheral circuit region PERI, the lower metal pattern 2273*a* formed in the uppermost metal layer of the peripheral circuit region PERI may not be connected to a contact. Similarly, in the external pad bonding area PA, an upper metal pattern 2372*a*, corresponding to the lower metal pattern 2273*a* formed in an uppermost metal layer of the peripheral circuit region PERI, and having the same shape as a lower metal pattern 2273*a* of the peripheral circuit region PERI, may be formed in an uppermost metal layer of the cell region CELL.

The lower bonding metals 2271*b* and 2272*b* may be formed on the second metal layer 2240*b* in the wordline bonding area WLBA. In the wordline bonding area WLBA, the lower bonding metals 2271*b* and 2272*b* of the peripheral circuit region PERI may be electrically connected to the upper bonding metals 2371*b* and 2372*b* of the cell region CELL by a Cu-to-Cu bonding.

Further, in the bitline bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The memory device 2000 may be the nonvolatile memory device according to example embodiments, and may perform the method of reprogramming data and/or the method of programming data according to example embodiments.

Figure 26:
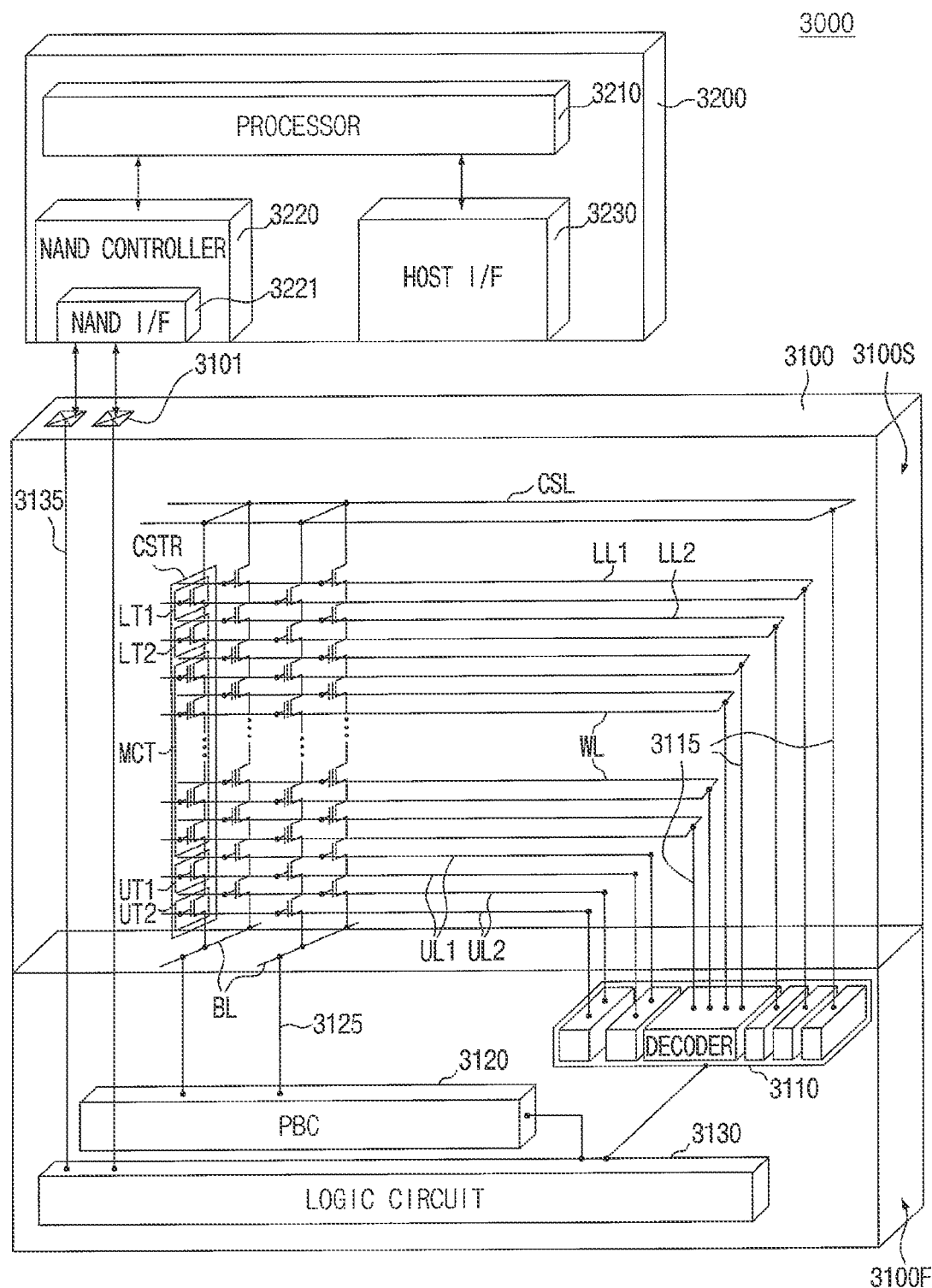
FIG. 26 is a block diagram illustrating an electronic system including a nonvolatile memory device according to an example embodiment.

FIG. 26 is a block diagram illustrating an electronic system including a nonvolatile memory device according to an example embodiment.

Referring to FIG. 26, an electronic system 3000 may include a semiconductor device 3100 and a controller 3200 electrically connected to the semiconductor device 3100. The electronic system 3000 may be a storage device including one or a plurality of semiconductor devices 3100 or an electronic device including the storage device. For example, the electronic system 3000 may be a solid state drive (SSD) device, a universal serial bus (USB), a computing system, a medical device, or a communication device that may include one or a plurality of semiconductor devices 3100.

The semiconductor device 3100 may be a memory device, for example, the nonvolatile memory device according to example embodiments described with reference to FIG. 5. The semiconductor device 3100 may include a first structure 3100F and a second structure 3100S on the first structure 3100F. The first structure 3100F may be a peripheral circuit structure including a decoder circuit 3110, a page buffer circuit 3120, and a logic circuit 3130. The second structure 3100S may be a memory cell structure including bitlines BL, a common source line CSL, wordlines WL, first and second upper gate lines UL1 and UL2, first and second lower gate lines LL1 and LL2, and memory cell strings CSTR between the bitlines BL and the common source line CSL.

In the second structure 3100S, each of the memory cell strings CSTR may include lower transistors LT1 and LT2 adjacent to the common source line CSL, upper transistors UT1 and UT2 adjacent to the bitlines BL, and a plurality of memory cell transistors MCT between the lower transistors LT1 and LT2 and the upper transistors UT1 and UT2.

In the first structure 3100F, the decoder circuit 3110, the page buffer circuit 3120 and the logic circuit 3130 may correspond to the address decoder 520, the page buffer circuit 530 and the control circuit 560 in FIG. 5, respectively.

The common source line CSL, the first and second lower gate lines LL1 and LL2, the wordlines WL, and the first and second upper gate lines UL1 and UL2 may be electrically connected to the decoder circuit 3110 through first connection wirings 3115 extending to the second structure 3110S in the first structure 3100F. The bitlines BL may be electrically connected to the page buffer circuit 3120 through second connection wirings 3125 extending to the second structure 3100S in the first structure 3100F. The input/output pad 3101 may be electrically connected to the logic circuit 3130 through an input/output connection wiring 3135 extending to the second structure 3100S in the first structure 3100F.

The controller 3200 may include a processor 3210, a NAND controller 3220 and a host interface 3230. The electronic system 3000 may include a plurality of semiconductor devices 3100, and in this case, the controller 3200 may control the plurality of semiconductor devices 3100. The processor 3210, a NAND interface 3221 included in the NAND controller 3220, and the host interface 3230 may correspond to the processor 410, the nonvolatile memory interface 460 and the host interface 440 in FIG. 4, respectively.

FIG. 27 is a perspective view of an electronic system including a nonvolatile memory device according to an example embodiment.

Referring to FIG. 27, an electronic system 4000 may include a main substrate 4001, a controller 4002 mounted on the main substrate 4001, at least one semiconductor package 4003, and a dynamic random access memory (DRAM) device 4004. The semiconductor package 4003 and the DRAM device 4004 may be connected to the controller 4002 by wiring patterns 4005 on the main substrate 4001.

The main substrate 4001 may include a connector 4006 having a plurality of pins connected to an external host. The number and layout of the plurality pins in the connector 4006 may be changed depending on a communication interface between the electronic system 4000 and the external host. In some example embodiments, the electronic system 4000 may be driven or may operate by a power source provided from the external host through the connector 4006.

The controller 4002 may write data in the semiconductor package 4003 or read data from the semiconductor package 4003, and may enhance an operation speed of the electronic system 4000.

The DRAM device 4004 may be a buffer memory for reducing the speed difference between the semiconductor package 4003 for storing data and the external host. The DRAM device 4004 included in the electronic system 4000 may serve as a cache memory, and may provide a space for temporarily storing data during the control operation for the semiconductor package 4003.

The semiconductor package 4003 may include first and second semiconductor packages 4003a and 4003b spaced apart from each other. The first and second semiconductor packages 4003a and 4003b may be semiconductor packages each of which includes a plurality of semiconductor chips 4200. Each of the first and second semiconductor packages 4003a and 4003b may include a package substrate 4100, the semiconductor chips 4200, bonding layers 4300 disposed under the semiconductor chips 4200, a connection structure 4400 for electrically connecting the semiconductor chips 4200 with the package substrate 4100, and a mold layer 4500 covering the semiconductor chips 4200 and the connection structure 4400 on the package substrate 4100.

The package substrate 4100 may be a printed circuit board (PCB) including package upper pads 4130. Each semiconductor chip 4200 may include an input/output pad 4210. The input/output pad 4210 may correspond to the input/output pad 3101 in FIG. 26. Each semiconductor chip 4200 may include gate electrode structures 5210, memory channel structures 5220 extending through the gate electrode structures 5210, and division structures 5230 for dividing the gate electrode structures 5210. Each semiconductor chip 4200 may include the nonvolatile memory device according to example embodiments described with reference to FIG. 5.

In some example embodiments, the connection structure 4400 may be a bonding wire for electrically connecting the input/output pad 4210 and the package upper pads 4130.

The nonvolatile memory device according to example embodiments may be packaged using various package types or package configurations.

The inventive concept may be applied to various electronic devices and systems that include the nonvolatile memory devices. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the example embodiments. Accordingly, all such modifications are intended to be included within the scope of the example embodiments as defined in the claims.

What is claimed is:

1. A method of reprogramming data in a nonvolatile memory device including a plurality of pages each of which includes a plurality of memory cells, the method comprising:
reading first page data programmed in a first page from among a plurality of page data programmed in the plurality of pages, the plurality of page data having a threshold voltage distribution including a plurality of states;
performing an error correction code (ECC) decoding on the first page data;
determining a number of times program loops were performed to program the first page data based on first program loop completion information associated with the first page;
determining a reprogram voltage based on the number of times;
selectively performing a reprogram operation on target bits in which an error occurs among a plurality of bits included in the first page data based on a result of performing the ECC decoding on the first page data and the reprogram voltage, the target bits corresponding to a first state among the plurality of states.

2. The method of claim 1, wherein: the first page in which the first page data is programmed includes a first data region in which the first page data is stored and a first spare region, a second page in which second page data is programmed after the first page data is programmed includes a second data region in which the second page data is stored and a second spare region, and the first program loop completion information representing the number of times the program loops were performed to program the first page data is stored in the second spare region.

3. The method of claim 2, wherein the voltage level of the reprogram voltage for performing the reprogram operation on the target bits is determined based on the first program loop completion information.

4. The method of claim 3, wherein the voltage level of the reprogram voltage increases as the number of times the program loops are performed while the first page data is programmed increases.

5. The method of claim 3, wherein the voltage level of the reprogram voltage is lower than a loop completion voltage level of a program voltage used while the first page data is programmed.

6. The method of claim 2, wherein only a part of a first number corresponding to the first program loop completion information is stored in the second spare region.

7. The method of claim 2, wherein: third page data is programmed before the first page data is programmed, second program loop completion information representing a number of times program loops are performed while the third page data is programmed is stored in the first spare region, and the voltage level of the reprogram voltage for performing the reprogram operation on the target bits is determined based on the second program loop completion information.

8. The method of claim 1, wherein the voltage level of the reprogram voltage is determined based on a shifted amount of threshold voltages due to a change in the threshold voltage distribution.

9. The method of claim 1, wherein performing the ECC decoding on the first page data comprises:
reading first parity data corresponding to the first page data;
performing the ECC decoding based on the first page data and the first parity data to generate first error corrected page data and to check a first error number of the first page data, the first error number representing a number of errors in the first page data; and
determining whether the reprogram operation is performed on the target bits based on the first error number and a reference number.

10. The method of claim 9, wherein determining whether the reprogram operation is performed on the target bits comprises:
determining that the reprogram operation is performed on the target bits when the first error number is greater than the reference number; and
determining that the reprogram operation is not performed on the target bits when the first error number is less than or equal to the reference number.

11. The method of claim 10, wherein selectively performing the reprogram operation on the target bits comprises:
selecting first bits in which an error occurs from among the plurality of bits by comparing the first page data before the ECC decoding is performed with the first error corrected page data after the ECC decoding is performed, when the first error number is greater than the reference number;
selecting second bits corresponding to the first state from among the plurality of bits by performing a read operation on two or more pages including the first page among the plurality of pages;
selecting the target bits based on the first bits and the second bits; and
reprogramming only target memory cells in which the target bits are stored by applying the reprogram voltage only to the target memory cells.

12. The method of claim 11, wherein the target bits are a part of the first bits and a part of the second bits.

13. The method of claim 11, wherein the reprogram voltage is applied one time to the target memory cells.

14. The method of claim 1, wherein the first state is a highest state among the plurality of states.

15. The method of claim 1, further comprising: performing at least one data recovery operation on the first page.

16. The method of claim 1, further comprising:
performing a reclaim operation in which data programmed in a first memory block including the first page is copied and programmed to a second memory block.

17. A method of programming data in a nonvolatile memory device including a plurality of pages each of which includes a plurality of memory cells, the method comprising:
   programming first page data to a first page among the plurality of pages by performing a program loop including a program operation and a program verification operation at least one time, the program operation being performed based on a program voltage, the program verification operation being performed based on a program verification voltage; and
   storing first program loop completion information representing a number of times program loops are performed while the first page data is programmed in a second page different from the first page.

18. The method of claim 17, wherein: the first page includes a first data region and a first spare region, the second page includes a second data region and a second spare region, the first page data is stored in the first data region, and the first program loop completion information is stored in the second spare region.

19. A method of operating a nonvolatile memory device including a plurality of pages each of which includes a plurality of memory cells, the method comprising:
   programming a plurality of page data to the plurality of pages, the plurality of page data having a threshold voltage distribution including a plurality of states; and
   selectively reprogramming the plurality of page data,
   wherein programming the plurality of page data comprises:
   programming first page data to a first page among the plurality of pages by performing a program loop including a program operation and a program verification operation at least one time, the program operation being performed based on a program voltage, the program verification operation being performed based on a program verification voltage; and
   storing first program loop completion information representing a number of times program loops are performed while the first page data is programmed in a second page different from the first page, wherein selectively reprogramming the plurality of page data comprises:
   reading the first page data programmed in the first page;
   performing an error correction code (ECC) decoding on the first page data; and
   selectively performing a reprogram operation on target bits in which an error occurs among a plurality of bits included in the first page data based on a result of performing the ECC decoding on the first page data and a reprogram voltage, the target bits corresponding to a first state among the plurality of states,
   wherein the first page in which the first page data is programmed includes a first data region storing the first page data and a first spare region,
   wherein a second page in which second page data is programmed after the first page data is programmed includes a second data region in which the second page data is stored and a second spare region in which the first program loop completion information is stored, and
   wherein a voltage level of the reprogram voltage for performing the reprogram operation on the target bits is determined based on the first program loop completion information.

\* \* \* \* \*